United States Patent [19]
Park et al.

[11] Patent Number: 6,045,610
[45] Date of Patent: Apr. 4, 2000

[54] METHODS OF MANUFACTURING MONOCRYSTALLINE SILICON INGOTS AND WAFERS BY CONTROLLING PULL RATE PROFILES IN A HOT ZONE FURNANCE

[75] Inventors: Jea-gun Park; Kyoo-chul Cho; Gon-sub Lee, all of Kyungki-do, Rep. of Korea

[73] Assignee: Samsung Electronics Co., Ltd., Rep. of Korea

[21] Appl. No.: 08/989,591

[22] Filed: Dec. 12, 1997

Related U.S. Application Data

[60] Provisional application No. 60/063,086, Oct. 24, 1997.

[30] Foreign Application Priority Data

| Feb. 13, 1997 | [KR] | Rep. of Korea | 97-4291 |
| Oct. 24, 1997 | [KR] | Rep. of Korea | 97-54899 |

[51] Int. Cl.⁷ .................................................. C30B 15/20
[52] U.S. Cl. .............................. 117/13; 117/14; 117/15; 117/201; 117/202
[58] Field of Search .................. 117/13, 14, 15, 117/201, 202

[56] References Cited

U.S. PATENT DOCUMENTS

| 3,951,729 | 4/1976 | Takagi et al. | 156/617 |
| 5,248,378 | 9/1993 | Oda et al. | 117/14 |
| 5,485,803 | 1/1996 | Habu | 117/14 |
| 5,779,791 | 7/1998 | Korb et al. | 117/15 |

FOREIGN PATENT DOCUMENTS

| 0 444 628 A1 | 9/1991 | European Pat. Off. . |
| 0 482 438 A1 | 4/1992 | European Pat. Off. . |
| 0 529 571 A1 | 3/1993 | European Pat. Off. . |
| 0 536 405 A1 | 4/1993 | European Pat. Off. . |
| 8-330316 | 12/1996 | Japan . |

OTHER PUBLICATIONS

U.S. application No. 09/057,907, Falster, filed Apr. 9, 1998.

Park et al., Effect of Crystal Defects on Device Characteristics, Proceeding of 2nd International Symposium on Advanced Science and Technology Si Material, Kona Hawaii, Nov. 25–29, 1996.

Voronkov, "The Mechanism of Swirl Defects Formation in Silicon", Journal of Crystal Growth, V. 59, 1982, pp. 625–643.

*Primary Examiner*—Felisa Hiteshew
*Attorney, Agent, or Firm*—Myers Bigel Sibley & Sajovec

[57] ABSTRACT

A silicon ingot is manufactured in a hot zone furnace by pulling the ingot from a silicon melt in the hot zone furnace in an axial direction, at a pull rate profile of the ingot from the silicon melt in the hot zone furnace that is sufficiently high so as to prevent interstitial agglomerates but is sufficiently low so as to confine vacancy agglomerates to a vacancy rich region at the axis of the ingot. The ingot so pulled is sliced into a plurality of semi-pure wafers each having a vacancy rich region at the center thereof that includes vacancy agglomerates and a pure region between the vacancy rich region and the wafer edge that is free of vacancy agglomerates and interstitial agglomerates. According to another aspect of the present invention, the ingot is pulled from the silicon melt in the hot zone furnace at a pull rate profile of the ingot from the silicon melt in the hot zone furnace that is sufficiently high so as to prevent interstitial agglomerates, but is also sufficiently low as to prevent vacancy agglomerates. Accordingly, when this ingot is sliced into wafers, the wafers are pure silicon wafers that may include point defects but that are free of vacancy agglomerates and interstitial agglomerates.

54 Claims, 15 Drawing Sheets

FIG. 3C
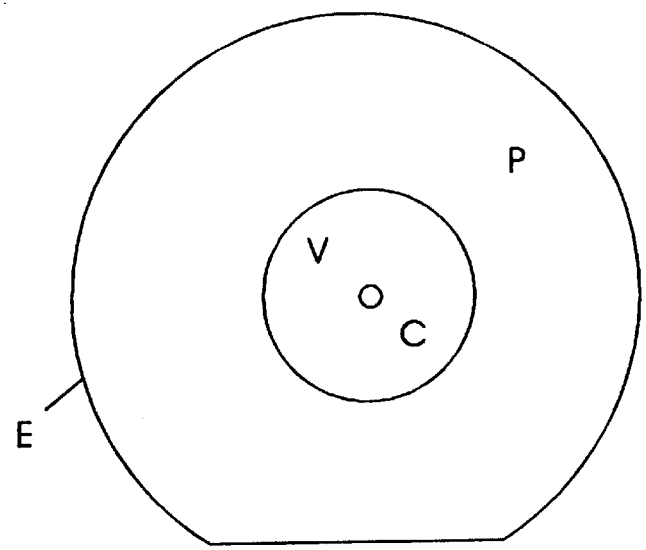
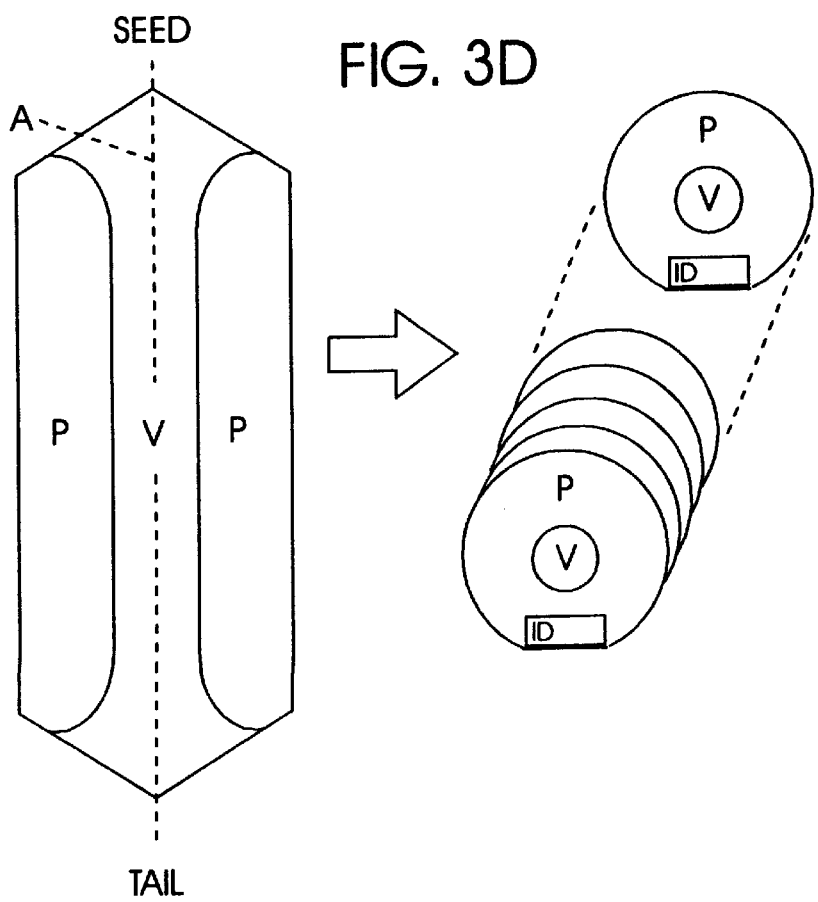
FIG. 3D

METHODS OF MANUFACTURING MONOCRYSTALLINE SILICON INGOTS AND WAFERS BY CONTROLLING PULL RATE PROFILES IN A HOT ZONE FURNACE

RELATED APPLICATIONS

This application claims the benefit of U.S. Provisional Application No. 60/063,086, entitled "*Methods of Forming Semiconductor Ingots and Ingots and Wafers Formed Therefrom*" filed on Oct. 24, 1997, and Korean Application No. 97-54899, filed Oct. 24, 1997, both of which are hereby incorporated herein in their entirety by reference.

FIELD OF THE INVENTION

This invention relates to microelectronic manufacturing methods and devices, and more particularly to silicon ingot manufacturing methods and silicon ingots and wafers manufactured thereby.

BACKGROUND OF THE INVENTION

Integrated circuits are widely used in consumer and commercial applications. Integrated circuits are generally fabricated from monocrystalline silicon. As the integration density of integrated circuits continues to increase, it generally is of increasing importance to provide high-quality monocrystalline semiconductor material for integrated circuits. Integrated circuits are typically produced by fabricating a large ingot of monocrystalline silicon, slicing the ingot into wafers, performing numerous microelectronic fabrication processes on the wafers and then dicing the wafers into individual integrated circuits that are packaged. Because the purity and crystallinity of the silicon ingot can have a large impact on the performance of the ultimate integrated circuit devices that are fabricated therefrom, increased efforts have been made to fabricate ingots and wafers with reduced numbers of defects.

Conventional methods of manufacturing monocrystalline silicon ingots will now be described. An overview of these methods is provided in Chapter 1 of the textbook "*Silicon Processing for the VLSI Era, Volume 1, Process Technology*", by Wolf and Tauber, 1986, pp. 1–35, the disclosure of which is hereby incorporated herein by reference. In manufacturing monocrystalline silicon, electronic grade polysilicon is converted into a monocrystalline silicon ingot. Polycrystalline silicon such as quartzite is refined to produce electronic grade polycrystalline silicon. The refined electronic grade polycrystalline silicon is then grown into a single crystal ingot using the Czochralski (CZ) or Float Zone (FZ) technique. Since the present invention relates to manufacturing a silicon ingot using the CZ technique, this technique will now be described.

CZ growth involves crystalline solidification of atoms from a liquid phase at an interface. In particular, a crucible is loaded with a charge of electronic grade polycrystalline silicon and the charge is melted. A seed crystal of silicon of precise orientation tolerances is lowered into the molten silicon. The seed crystal is then withdrawn at a controlled rate in the axial direction. Both the seed crystal and the crucible are generally rotated during the pulling process, in opposite directions.

The initial pull rate is generally relatively rapid so that a thin neck of silicon is produced. Then, the melt temperature is reduced and stabilized so that the desired ingot diameter can be formed. This diameter is generally maintained by controlling the pull rate. The pulling continues until the charge is nearly exhausted, at which time a tail is formed.

FIG. 1 is a schematic diagram of a CZ puller. As shown in FIG. 1, the CZ puller 100 includes a furnace, a crystal pulling mechanism, an environment controller and a computer-based control system. The CZ furnace is generally referred to as a hot zone furnace. The hot zone furnace includes heating elements 102 and 104, an inner crucible 106 which may be made of quartz, an outer crucible 108 which may be made of graphite and a rotation shaft 110 that rotates in a first direction 112 as shown. A hot shield 114 may provide additional thermal distribution.

The crystal pulling mechanism includes a crystal pulling shaft 120 which may rotate in direction 122 opposite direction 112 as shown. Crystal pulling shaft 120 holds seed crystal 124, which is pulled from molten polysilicon charge 126 in crucible 106 to form ingot 128.

The ambient control system may include the chamber enclosure 130, a cooling port 132 and other flow controllers and vacuum exhaust systems that are not shown. A computer-based control system may be used to control the heating elements, puller and other electrical and mechanical elements.

In order to grow a monocrystalline silicon ingot, the seed crystal 124 is contacted to the molten silicon charge 126 and is gradually pulled in the axial direction (up). Cooling and solidification of the molten silicon charge 126 into monocrystalline silicon occurs at the interface 130 between the ingot 128 and the molten silicon 126.

Real silicon ingots differ from ideal monocrystalline ingots because they include imperfections or defects. These defects are undesirable in fabricating integrated circuit devices. These defects may be generally classified as point defects or agglomerates (three-dimensional defects). Point defects are of two general types: vacancy point defects and interstitial point defects. In a vacancy point defect, a silicon atom is missing from one of its normal positions in the silicon crystal lattice. This vacancy gives rise to a vacancy point defect. On the other hand, if an atom is found at a non-lattice site (interstitial site) in the silicon crystal, it gives rise to an interstitial point defect.

Point defects are generally formed at the interface 130 between the molten silicon 126 and the solid silicon 128. However, as the ingot 128 continues to be pulled, the portion that was at the interface begins to cool. During cooling, diffusion of vacancy point defects and interstitial point defects may cause defects to coalesce and form vacancy agglomerates or interstitial agglomerates. Agglomerates are three-dimensional (large) structures that arise due to coalescence of point defects. Interstitial agglomerates are also referred to as dislocation defects or D-defects. Agglomerates are also sometimes named by the technique that is used to detect these defects. Thus, vacancy agglomerates are sometimes referred to as Crystal-Originated Particles (COP), Laser Scattering Tomography (LST) defects or Flow Pattern Defects (FPD). Interstitial agglomerates are also known as Large Dislocation (L/D) agglomerates. A discussion of defects in monocrystalline silicon is provided in Chapter 2 of the above-mentioned textbook by Wolf and Tauber, the disclosure of which is hereby incorporated herein by reference.

It is known that many parameters may need to be controlled in order to grow a high purity ingot having low numbers of defects. For example, it is known to control the pull rate of the seed crystal and the temperature gradients in the hot zone structure. Voronkov's Theory found that the ratio of V to G (referred to as V/G) can determine the point defect concentration in the ingot, where V is the pull rate of the ingot and G is the temperature gradient of the ingot-melt interface. Voronkov's Theory is described in detail in *"The Mechanism of Swirl Defects Formation in Silicon"* by Voronkov, Journal of Crystal Growth, Vol. 59, 1982, pp. 625–643.

An application of Voronkov's Theory may be found in a publication by the present inventor et al. entitled *"Effect of Crystal Defects on Device Characteristics"*, Proceedings of the Second International Symposium on Advanced Science and Technology of Silicon Material, Nov. 25–29, 1996, p. 519. At FIG. 15, reproduced herein as FIG. 2, a graphical illustration of vacancy and interstitial concentrations, as a function of V/G is shown. Voronkov's Theory shows that the generation of vacancy/interstitial mixture in a wafer is determined by V/G. More particularly, for V/G ratios below a critical ratio, an interstitial rich ingot is formed, while for V/G ratios above the critical ratio, a vacancy rich ingot is formed.

Notwithstanding many theoretical investigations by physicists, material scientists and others, and many practical investigations by CZ puller manufacturers, there continues to be a need to reduce the defect density in monocrystalline silicon wafers. The ultimate need is for pure silicon wafers that are free of vacancy and interstitial agglomerates.

SUMMARY OF THE INVENTION

The present invention provides methods of manufacturing a silicon ingot in a hot zone furnace by pulling the ingot from a silicon melt in the hot zone furnace in an axial direction, at a pull rate profile of the ingot from the silicon melt in the hot zone furnace that is sufficiently high so as to prevent interstitial agglomerates but is sufficiently low so as to confine vacancy agglomerates to a vacancy rich region at the axis of the ingot. The ingot so pulled is sliced into a plurality of semi-pure wafers each having a vacancy rich region at the center thereof that includes vacancy agglomerates and a pure region between the vacancy rich region and the wafer edge that is free of vacancy agglomerates and interstitial agglomerates.

The present invention stems from the realization that agglomerates will form from point defects only if the point defect concentration exceeds a certain critical concentration. If the point defect concentration (vacancy or interstitial) can be maintained below this critical concentration, agglomerates will not form as the ingot is being pulled. In order to maintain point defect concentrations below critical point defect concentrations, the ratio of pull rate to temperature gradient at the ingot-melt interface (V/G) is confined (1) above a first critical ratio of pull rate to temperature gradient at the ingot-melt interface that must be maintained in order to prevent interstitial agglomerates and (2) below a second critical ratio of pull rate to temperature gradient at the ingot-melt interface that cannot be exceeded in order to confine vacancy agglomerates to a vacancy rich region at the center of the ingot. The pull rate profile is therefore adjusted to maintain the ratio of pull rate to temperature gradient above the first critical ratio and below the second critical ratio as the ingot is pulled from the silicon melt in the hot zone furnace.

According to another aspect of the present invention, the ingot is pulled from the silicon melt in the hot zone furnace at a pull rate profile of the ingot from the silicon melt in the hot zone furnace that is sufficiently high so as to prevent interstitial agglomerates, but is also sufficiently low as to prevent vacancy agglomerates. Accordingly, when this ingot is sliced into wafers, the wafers are pure silicon wafers that may include point defects but that are free of vacancy agglomerates and interstitial agglomerates.

According to this aspect of the invention, it has been determined that if the V/G ratio is confined to within a narrower range, both the point interstitial concentration and the point vacancy concentration can be maintained below the critical point defect concentrations that will form agglomerates. Thus, the entire ingot can be agglomerate free.

To form pure silicon, a first critical ratio of pull rate to temperature gradient at the ingot melt interface is determined, that must be maintained to prevent interstitial agglomerates. A second critical ratio of pull rate to temperature gradient at the ingot-melt interface that cannot be exceeded in order to prevent vacancy agglomerates is determined. A pull rate profile is then determined that maintains the ratio of pull rate to temperature gradient above the first critical ratio and below the second critical ratio as the ingot is pulled from the silicon melt in the hot zone surface.

In order to maintain the ratio of pull rate to temperature gradient at the ingot-melt interface between the two critical ratios, radial temperature gradients and axial temperature gradients are considered. In the radial direction, the temperature gradient across a wafer will generally vary because of the different thermal environments that are experienced by the central portion of the wafer compared to the edge portion. More specifically, the temperature gradient generally is higher at the wafer edge compared to the wafer center, due to thermal characteristics. The pull rate is always constant across the wafer. Therefore, the ratio of V/G generally decreases from the center of the wafer to edge of the wafer in the radial direction. The pull rate and hot zone furnace are designed to maintain the V/G ratio, from the center of the wafer to within a diffusion length of the edge of the wafer, below the critical point defect concentrations that would cause agglomerates, i.e. between the first and second critical ratios. Similar considerations apply in the axial direction. In the axial direction, the temperature gradient generally decreases as more of the ingot is pulled, due to the increased thermal mass of the ingot. Accordingly, as the ingot is pulled, the pull rate generally must be decreased in order to maintain the ratio of V/G between the first and second critical ratios.

Thus, by controlling the pull rate profile to maintain V/G between two critical ratios, semi-pure wafers with a vacancy rich region at the center thereof and a pure region between the vacancy rich region and the wafer edge may be formed. The vacancy rich region may include both vacancy point as well as agglomerate defects, and the pure region includes neither vacancy nor interstitial agglomerates. Alternatively and preferably, pure wafers may be formed that may include point defects but that are free of vacancy agglomerates and interstitial agglomerates.

The first and second critical ratios may be determined empirically or by using simulations. The ratios may be determined empirically by slicing a reference ingot into wafers or by slicing the reference ingot axially. Combinations of empirical and simulation techniques may be used.

In particular, the first critical ratio and the second critical ratio may be empirically determined by pulling a reference ingot from a silicon melt in the hot zone furnace at a pull rate that varies over a range of pull rates. The reference ingot is then sliced into wafers. For semi-pure silicon wafers, a wafer having a predetermined size vacancy rich region and that is also free of interstitial agglomerates is identified. Preferably, a wafer having a smallest vacancy rich region and that is also free of interstitial agglomerates is identified. The first and second critical ratios for semi-pure silicon are calculated from the pull rate of the identified wafer and the position of the identified wafer in the ingot.

In order to determine the first and second critical ratios for pure silicon wafers, the reference ingot is pulled, sliced into wafers, and a wafer that is free of vacancy agglomerates and interstitial agglomerates is identified. The first and second critical ratios for pure silicon are determined from the pull rate of the identified wafer and the position of the identified wafer in the ingot.

The reference ingot is preferably pulled from the silicon melt in the hot zone furnace at a pull rate that varies over a range of pull rates from a first pull rate, to a second pull rate that is lower than the first pull rate, to a third pull rate that is higher than the second pull rate and that may be lower or higher than the first pull rate. The first, second and third pull rates are preferably based upon the desired diameter of ingots and expected V/G ratios. Linear changes in pull rates are preferably used so that the first and second critical ratios can be determined.

In another empirical technique, a reference ingot is pulled from the silicon melt in the hot zone furnace at a pull rate that varies over a range of pull rates. The reference ingot is then axially sliced. For semi-pure wafers, at least one axial position in the axially sliced reference ingot is identified, having a smallest vacancy rich region and that is free of interstitial agglomerates. The first and second critical ratios for semi-pure silicon are then calculated from the pull rate corresponding to the identified axial position in the axially sliced ingot.

In order to form perfect silicon, at least one axial position in an axially sliced reference ingot is identified having no interstitial or vacancy agglomerates. The first and second critical ratios for pure silicon are then calculated from the pull rate of the identified at least one axial position and the location of the identified axial position in the axially sliced ingot.

The first and second critical ratios may also be determined theoretically using simulations. In particular, the first and second critical ratios may be identified from Voronkov's Theory. A pull rate to radial temperature gradient profile may be determined by simulating operation of a specific hot zone furnace during ingot pulling. A pull rate to axial temperature profile may be determined by simulating operation of the hot zone furnace during ingot pulling. A pull rate profile that maintains the ratio of pull rate to temperature gradient in the ingot above the first critical ratio and below the second critical ratio may then be determined from the simulated pull rate to radial temperature profile and the simulated pull rate to axial temperature profile.

It will also be understood that the first and second critical ratios for pure silicon may be identified in a two step process. First, the first and second critical ratios for semi-pure silicon may be determined empirically and/or theoretically. Then, the hot zone structure may be modified until the first and second critical ratios can be determined empirically and/or theoretically.

The present invention can provide a plurality of similar semi-pure monocrystalline silicon wafers that are manufactured from one silicon ingot. Each of the semi-pure silicon wafers has a vacancy rich region at the center thereof that includes vacancy agglomerates and a pure region between the vacancy rich region and the wafer edge that is free of vacancy agglomerates and interstitial agglomerates. The vacancy rich region of each of the wafers has substantially the same diameter. Preferably, the pure region is at least 36% of the wafer area. More preferably, the pure region is at least 60% of the wafer area.

If the ratio of V/G is controlled even more tightly, the present invention can produce a plurality of pure monocrystalline silicon wafers that are manufactured from one silicon ingot, wherein each of the pure silicon wafers is free of vacancy agglomerates and interstitial agglomerates. Accordingly, by maintaining the ratio of pull rate to temperature gradient at the ingot-melt interface between upper and lower bounds, agglomerate defects can be confined to a vacancy rich region at the center of the wafer or can be eliminated to produce pure silicon wafers.

BRIEF DESCRIPTION OF THE DRAWINGS

FIGS. 3A–3E illustrate an overview of the fabrication of wafers having a vacancy rich region at the center thereof and a pure region between the vacancy rich region and the wafer edge.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Overview: Vacancy Rich and Perfect Wafers

Figure 1:
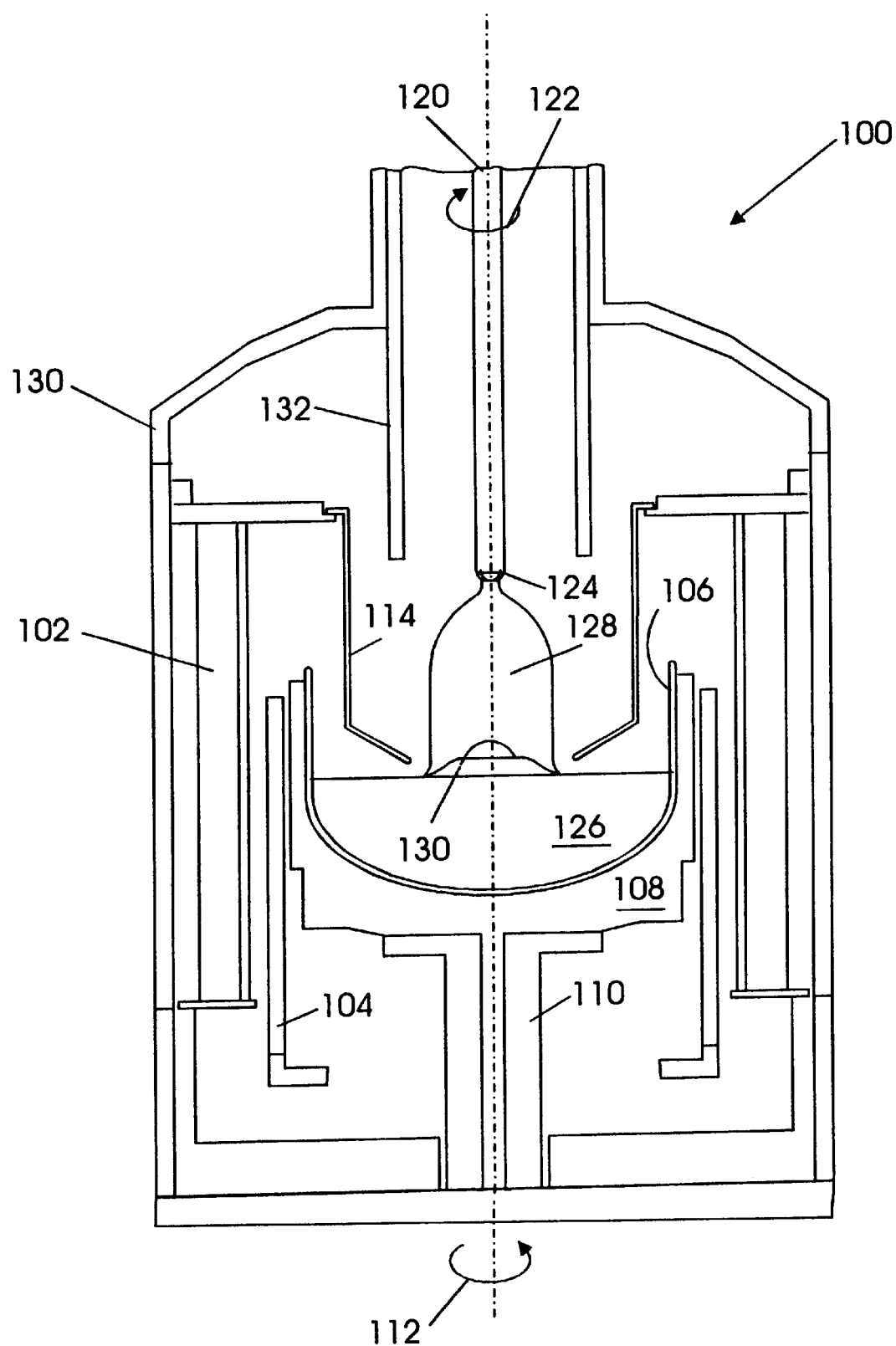
FIG. 1 is a schematic representation of a Czochralski puller for growing monocrystalline silicon ingots.
Figure 2:
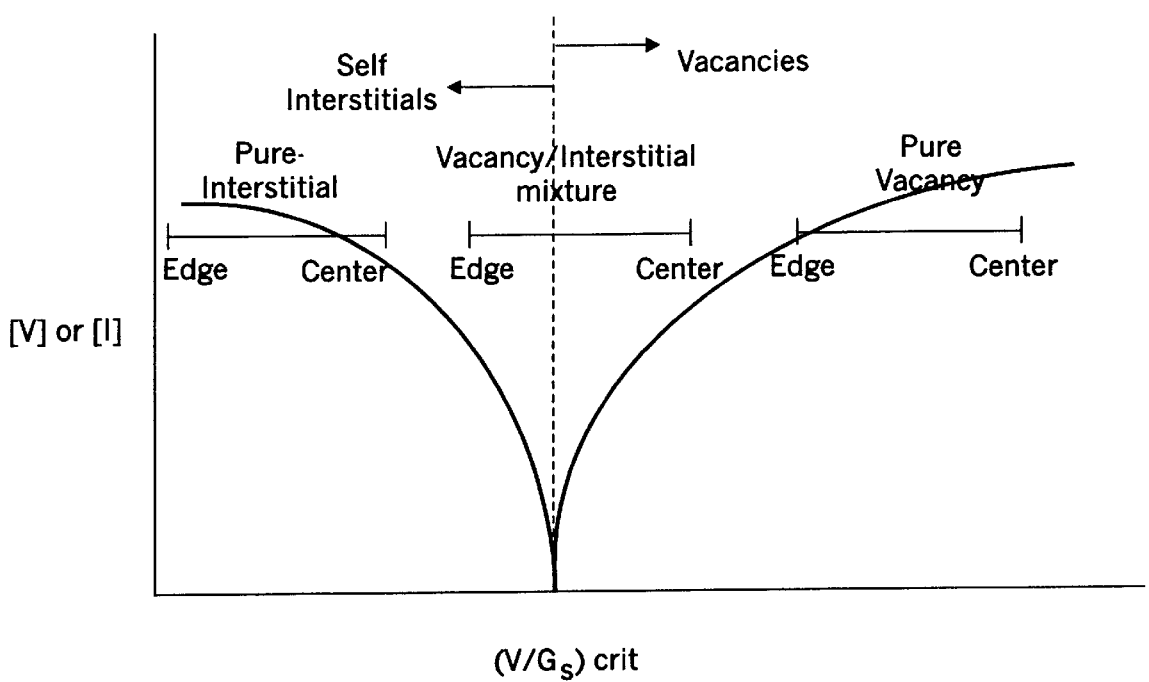
FIG. 2 graphically illustrates Vronokov's Theory.
Figure 3A:
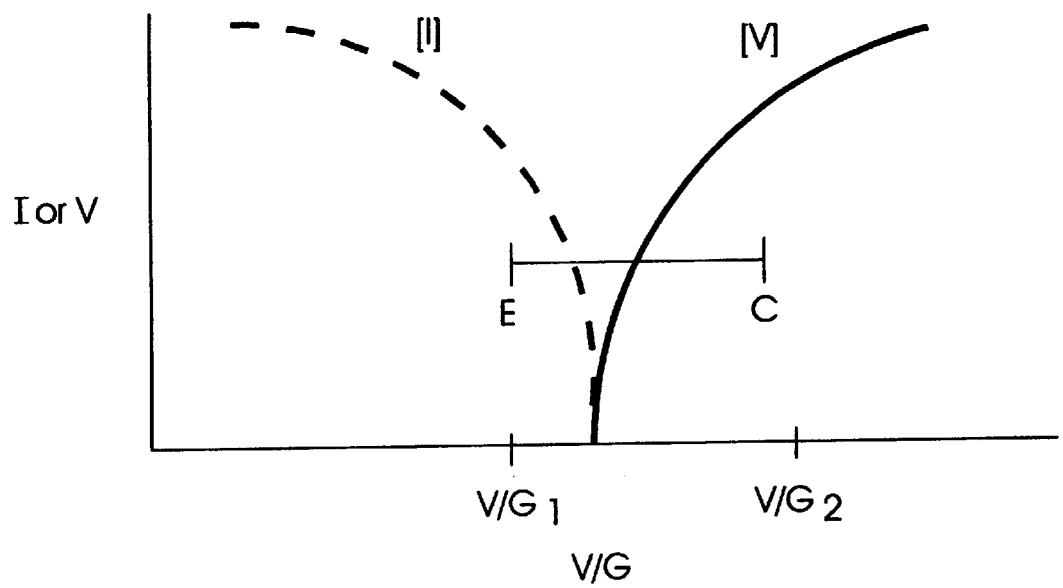

Referring now to FIGS. 3A–3E, an overview of the fabrication of semi-pure wafers having (1) a vacancy rich region at the center thereof that may include vacancy agglomerates and (2) a pure region between the vacancy rich region and the wafer edge that is free of vacancy agglomerates and interstitial agglomerates, will now be described. As shown in FIG. 3A, the fabrication of these vacancy rich wafers can begin with an overview of Voronkov's Theory. Voronkov's Theory is graphically illustrated in FIG. 3A. As shown by the line beginning from the edge (E) and ending at the center (C), it has been found according to the present invention that if the ratio of pull rate to temperature gradient at the ingot melt surface, referred to as V/G, is maintained greater than $(V/G)_1$ at a diffusion length from the edge E, identified by point a, and less than $(V/G)_2$ at the center C, then semi-pure wafers having a vacancy rich region at the center thereof and a pure region between the vacancy rich region and the wafer edge may be fabricated. In particular, V/G will vary radially across a wafer in an ingot, and generally will decrease from the wafer center to the wafer edge due to the differing thermal characteristics at the center and edge of the wafer. Thus, a given wafer experiences a radial V/G range as shown in FIG. 3A from the center (C) to the edge (E) thereof.

A critical concern in the fabrication of silicon ingots and wafers is the formation of agglomerates, either vacancy or interstitial, in the wafer. It is known that agglomerates are formed due to coalescence of point defects that are formed during the initial fabrication of the ingot from the melt. The point defect concentration is generally determined by conditions at the interface between the silicon ingot and the silicon melt. Then, as the ingot is pulled further, diffusion and cooling determines the coalescence of point defects to form agglomerates.

Figure 3B:
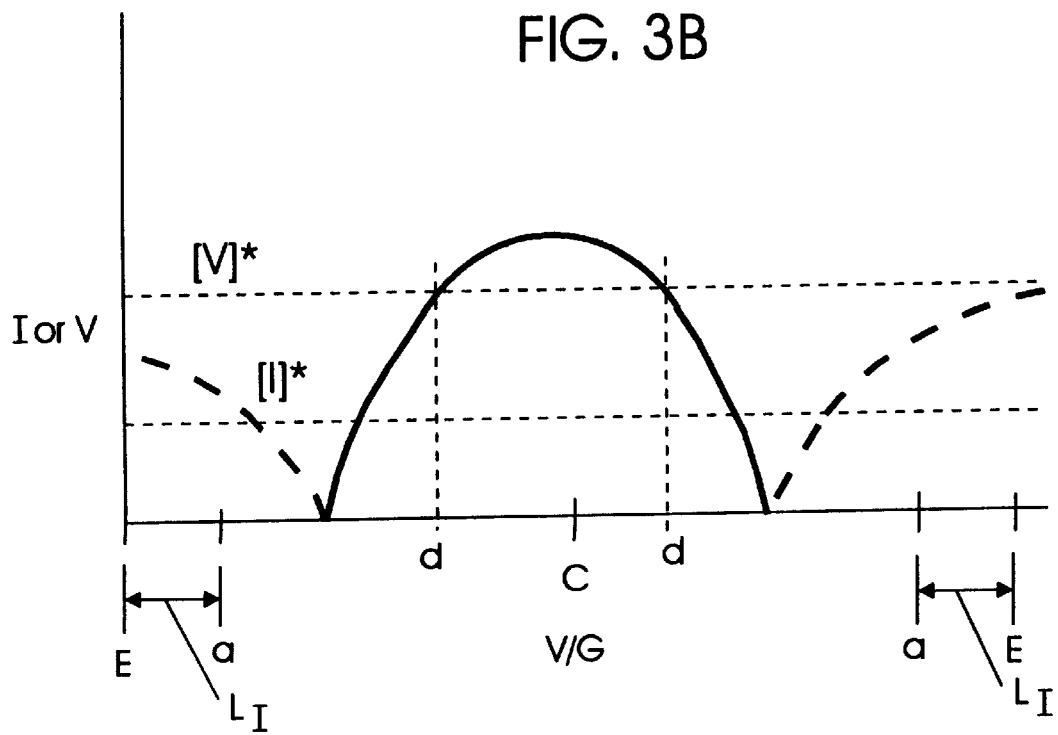

As shown in FIG. 3B, it has been found, according to the invention, that a critical vacancy point defect concentration [V]* and a critical interstitial point defect concentration [I]* exist, below which point defects will not coalesce into agglomerates. It has been found according to the present invention that if the concentration of point defects is maintained below these critical concentrations in the peripheral area of the wafer, then a vacancy rich region is formed at the center of the wafer, but a pure region is formed between the vacancy rich region and the wafer edge.

Thus, as shown in FIG. 3B, the vacancy concentration is maintained below the critical vacancy concentration [V]* across the wafer except near the center C thereof. Thus, as shown in FIG. 3C, a vacancy rich region [V] is formed at the center thereof, but the area outside the vacancy rich region [V] to the wafer edge, is free of vacancy agglomerates and is therefore designated [P] (pure or perfect).

Referring again to FIG. 3B, for interstitials, the interstitial concentration is maintained below the critical interstitial concentration [I]* from the center C of the wafer until a diffusion length $L_I$ from the edge E of the wafer corresponding to point a. Between the diffusion length $L_I$ of the wafer and the edge E, even if the interstitial concentration is initially above the critical concentration [I]* at the ingot-melt interface, diffusion will allow the interstitial vacancies to diffuse out of the ingot and not form agglomerates during the crystal growth. The diffusion length $L_I$ is generally between about 2.5 and 3 cm for 8 inch wafers. Accordingly, as shown in FIG. 3C, a semi-pure wafer having a vacancy rich region [V] at the center thereof and a perfect region [P] between the vacancy rich region and the edge, is formed. Preferably, the pure region [P] is at least 36% of the wafer area and more preferably is at least 60% of the wafer area.

In order to form wafers of FIG. 3C, V/G must be maintained greater than $(V/G)_1$ at point a and less than or equal to $(V/G)_2$ at the center C. In order to maintain the ratio of V/G between these two critical values, two thermal considerations are taken into account. First, the radial temperature gradient G experienced from the center C of the wafer to the diffusion length a of the wafer must be maintained within these values. Thus, V/G at the center should be close to $(V/G)_2$ in order to confine vacancy agglomerates to the vacancy rich region. Moreover, V/G at the diffusion length $L_I$ from the edge must be maintained greater than $(V/G)_1$ in order to prevent interstitial agglomerates. Accordingly, the hot zone of the furnace should preferably be designed to maintain a variation in G from the center of the wafer to the diffusion length of the wafer, such that V/G is maintained between $(V/G)_2$ and $(V/G)_1$.

A second consideration is that G will vary axially as the wafer is pulled from the melt beginning at the seed and ending at the tail. In particular, the increasing thermal mass of the ingot, the decreasing thermal mass of the melt and other thermal considerations will generally cause G to decrease as the ingot is pulled from the melt. Thus, in order to maintain V/G within the first and second critical ratios, the pull rate profile is adjusted as the ingot is pulled from the silicon melt in the hot zone furnace.

By controlling V/G as the ingot is pulled, vacancy agglomerates can be confined to a vacancy rich region [V] near the axis A of the ingot shown in FIG. 3D. Interstitial agglomerates are not formed, so that the area of the ingot outside the vacancy rich region [V] is labeled [P] for pure or perfect. As also shown in FIG. 3D, this yields a plurality of semi-pure wafers having vacancy rich regions [V] at the center thereof that include vacancy agglomerates, and pure regions between the vacancy rich region and a wafer edge that is free of vacancy agglomerates and interstitial agglomerates. The diameter of the vacancy rich region [V] is the same in each wafer. The identification of the plurality of wafers that are formed from a single ingot may be found by the ID number, labeled ID in FIG. 3D, which is generally an alphanumeric code that is marked on every wafer. This eighteen character field can identify the wafers as all coming from a single ingot.

Figure 3E:
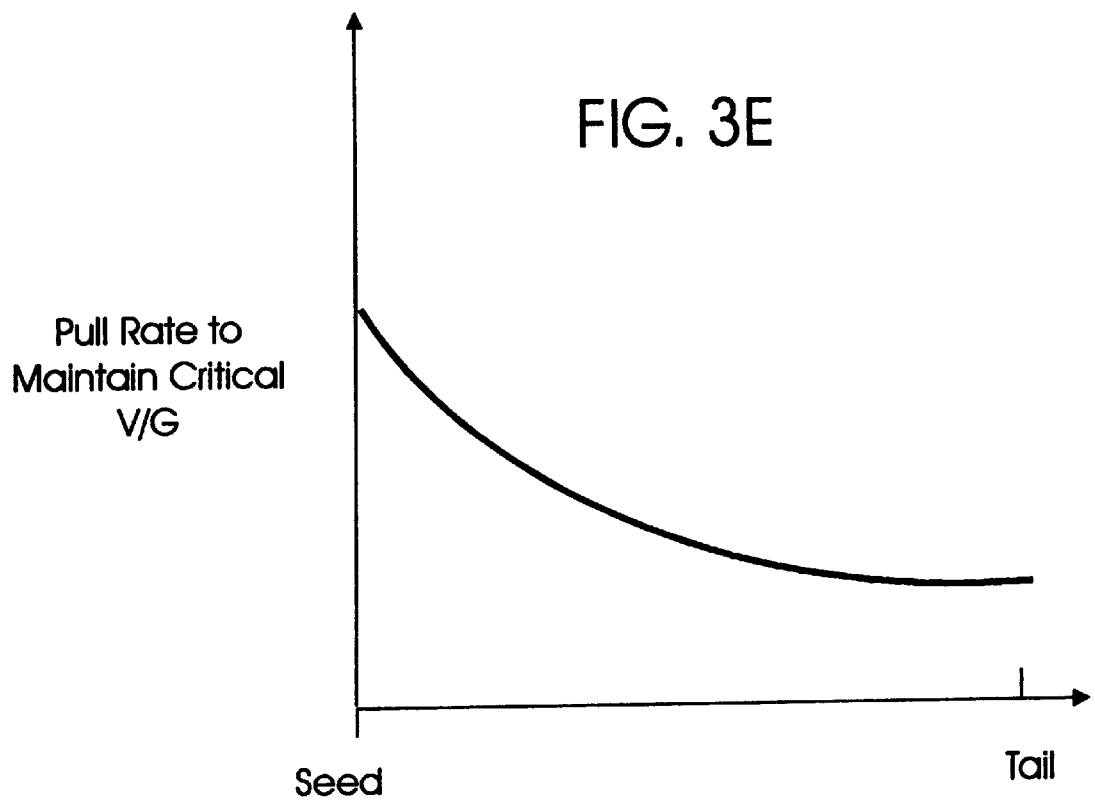

FIG. 3E illustrates a pull rate profile that is used to maintain V/G between the two critical ratios, as the ingot is pulled from the melt. Since G generally decreases as the ingot is pulled from the melt, the pull rate V is also generally decreased to maintain V/G between the two critical ratios. In order to allow for expected process variations, V/G is preferably maintained midway between the first and second critical ratios. Thus, a guard band is preferably maintained to allow for process variations.

Overview: Pure Silicon Wafers

Figure 4A:
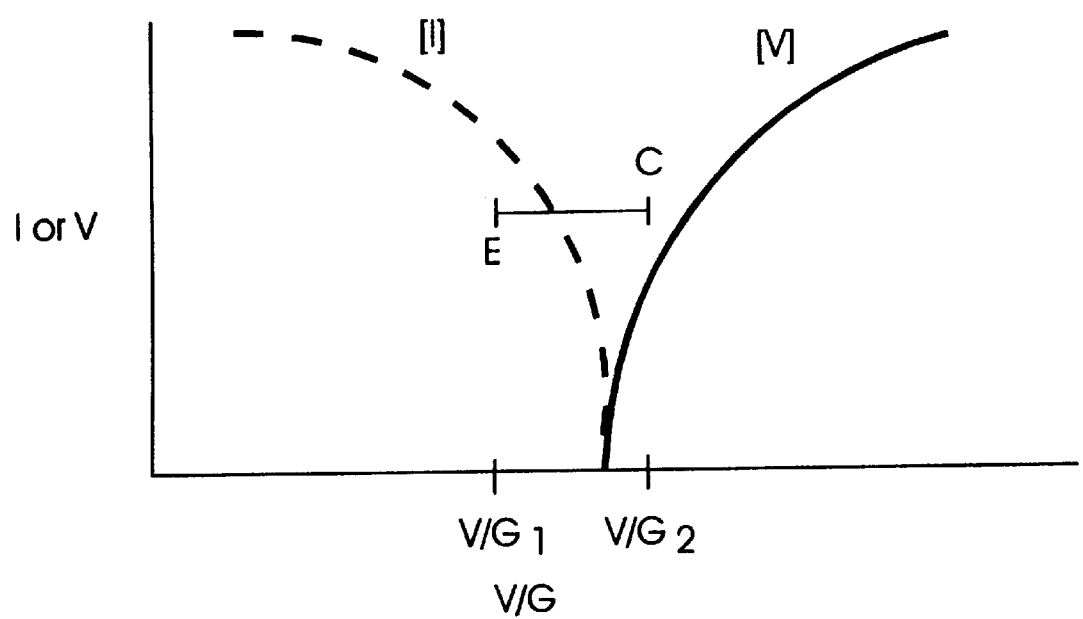
FIGS. 4A–4E illustrate an overview of the fabrication of wafers that are free of agglomerates.
Figure 4B:
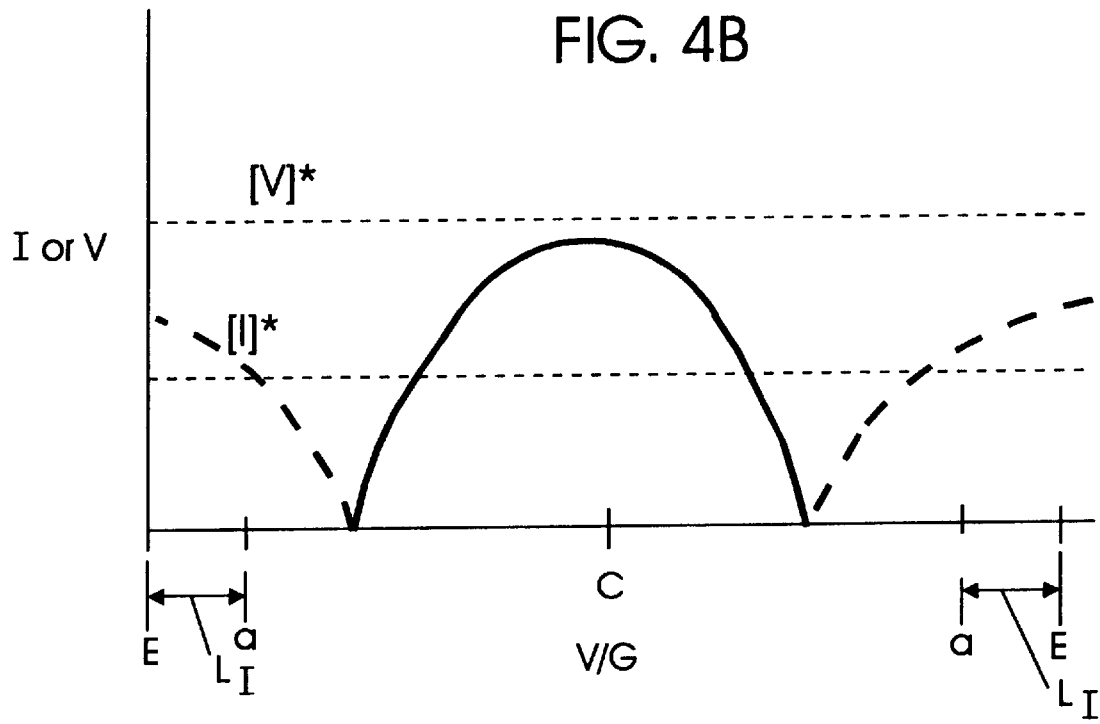
Figure 4C:
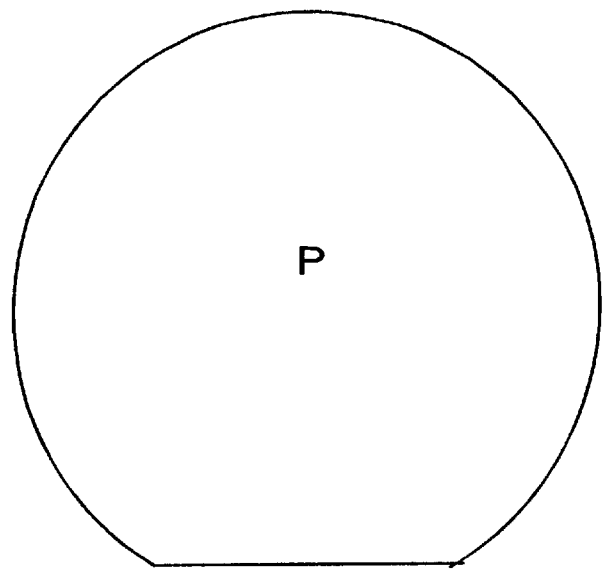
Figure 4D:
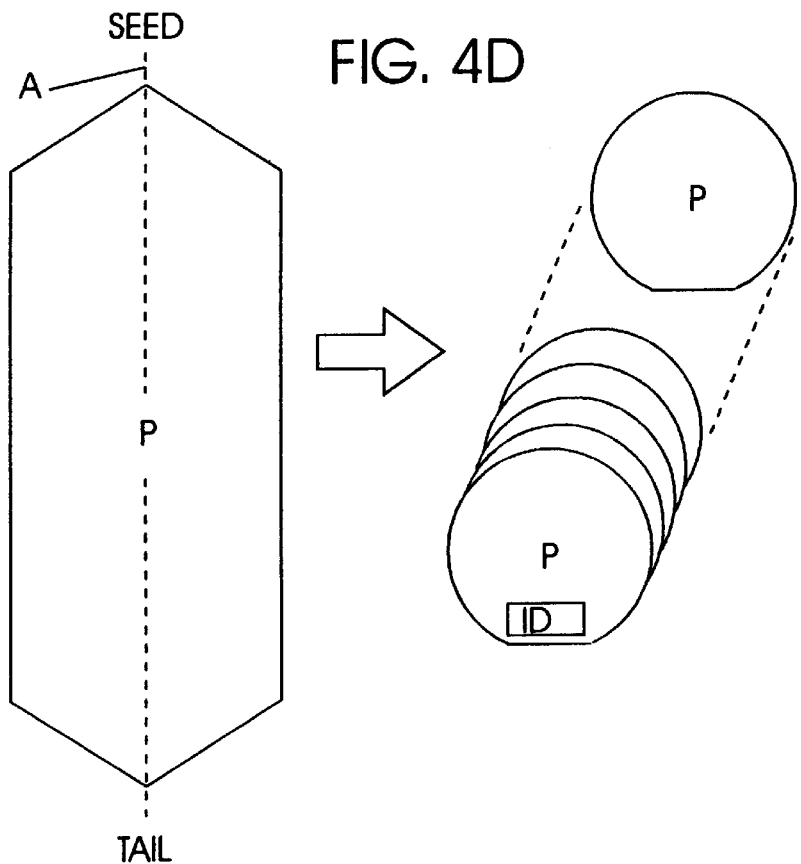
Figure 4E:
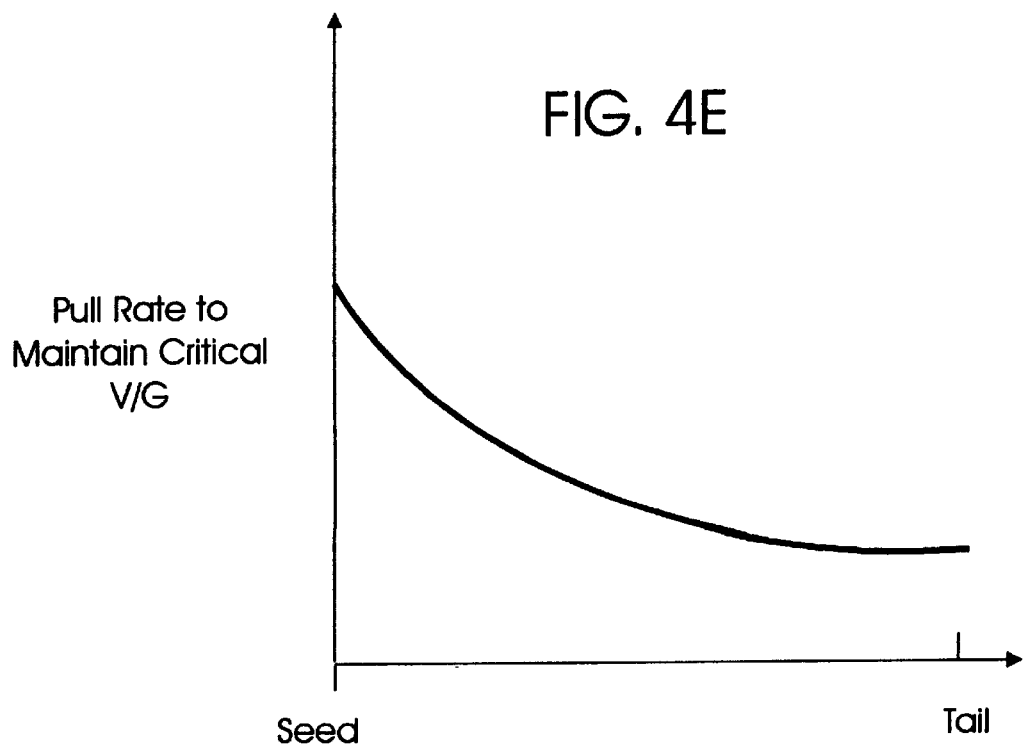

FIGS. 4A–4E correspond to FIG. 3A–3E and illustrate the control of a pull rate profile to form pure silicon ingots and wafers. As shown in FIG. 4A, if V/G is maintained within a tighter tolerance between the wafer center C and a diffusion length a from the wafer edge E, the formation of vacancy agglomerates as well as interstitial agglomerates may be prevented throughout the wafer. Thus, as shown in FIG. 4B, in the center of the wafer (the axis A of the ingot), the ratio of V/G is maintained lower than the critical ratio $(V/G)_2$ which would form vacancy agglomerates. Similarly, V/G is maintained above the critical ratio $(V/G)_1$ that would form interstitial agglomerates. Accordingly, pure silicon [P] of FIG. 4C is formed that is free of interstitial agglomerates and vacancy agglomerates. The pure ingot is shown in FIG. 4D, along with a set of pure wafers. A pull rate profile for pure silicon is shown in FIG. 4E.

Determination of Pull Rate Profiles

According to the present invention, in order to form semi-pure wafers having a vacancy rich region at the center thereof, and a pure region between the vacancy rich region and the wafer edge, a pull rate profile (FIG. 3E) is determined that maintains the ratio of pull rate to temperature gradient in the ingot above a first critical ratio and below a second critical ratio as the ingot is pulled from the silicon melt in the hot zone furnace. Similarly, in order to form pure silicon that may include point defects but that is free of vacancy agglomerates and interstitial agglomerates, a pull rate profile (FIG. 4E) is determined that maintains the ratio of pull rate to temperature gradient above a first critical ratio and below a second critical ratio, as the ingot is pulled from the silicon melt in the hot zone furnace. The determination of the pull rate profiles will now be described.

The pull rate profile may be determined theoretically by simulation, empirically by axial slicing of reference ingots, empirically by slicing a reference ingot into wafers or by a combination of these techniques. Moreover, the pull rate profile for pure silicon may be determined by first determining a pull rate profile for semi-pure silicon and then modifying the hot zone structure to obtain a pull rate profile for pure silicon. These techniques will now be described.

Pull Rate Profile by Simulation

Figure 5:
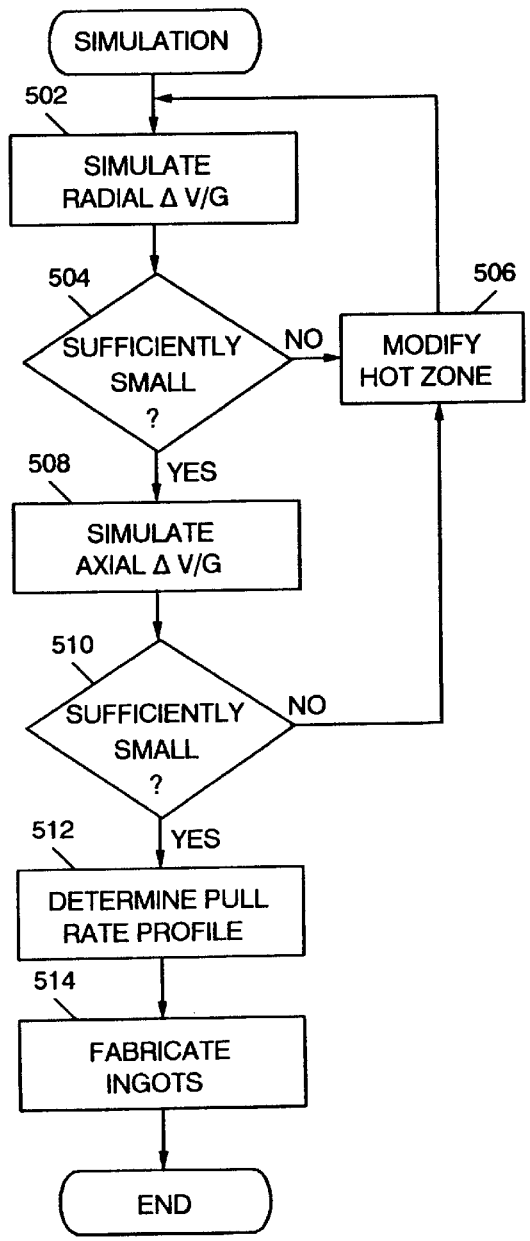
FIG. 5 illustrates theoretical determination of a pull rate profile by simulation according to the present invention.

Referring to FIG. 5, the theoretical determination of a pull rate profile by simulation will now be described. As shown in FIG. 5, commercial simulation software may be used to simulate the radial change in V/G (referred to as $\Delta(V/G)$) at Block 502. Then, at Block 504, a determination is made as to whether the change in V/G from the center to the diffusion length $L_I$ from the edge is sufficiently small to satisfy the criteria to form semi-pure wafers or pure wafers. In particular, for silicon having a vacancy rich region as illustrated in FIG. 3C, the $\Delta(V/G)$ must be between $(V/G)_1$ and $(V/G)_2$ for all regions between radius d and radius a of the wafers. Stated alternatively, interstitial point defect concentration must be less than [I]* for radii of the wafer between the center C and a, and vacancy point concentration must be less than [V]* for radii of the wafer greater than d. Similarly, to form pure silicon as shown in FIG. 4, the $\Delta(V/G)$ must be less than or equal to $(V/G)_2-(V/G)_1$ to maintain [V] below the critical concentration [V] *, and to also maintain [I] below the critical concentration [I]* for all radii from the center C to the diffusion distance a.

Figure 9:
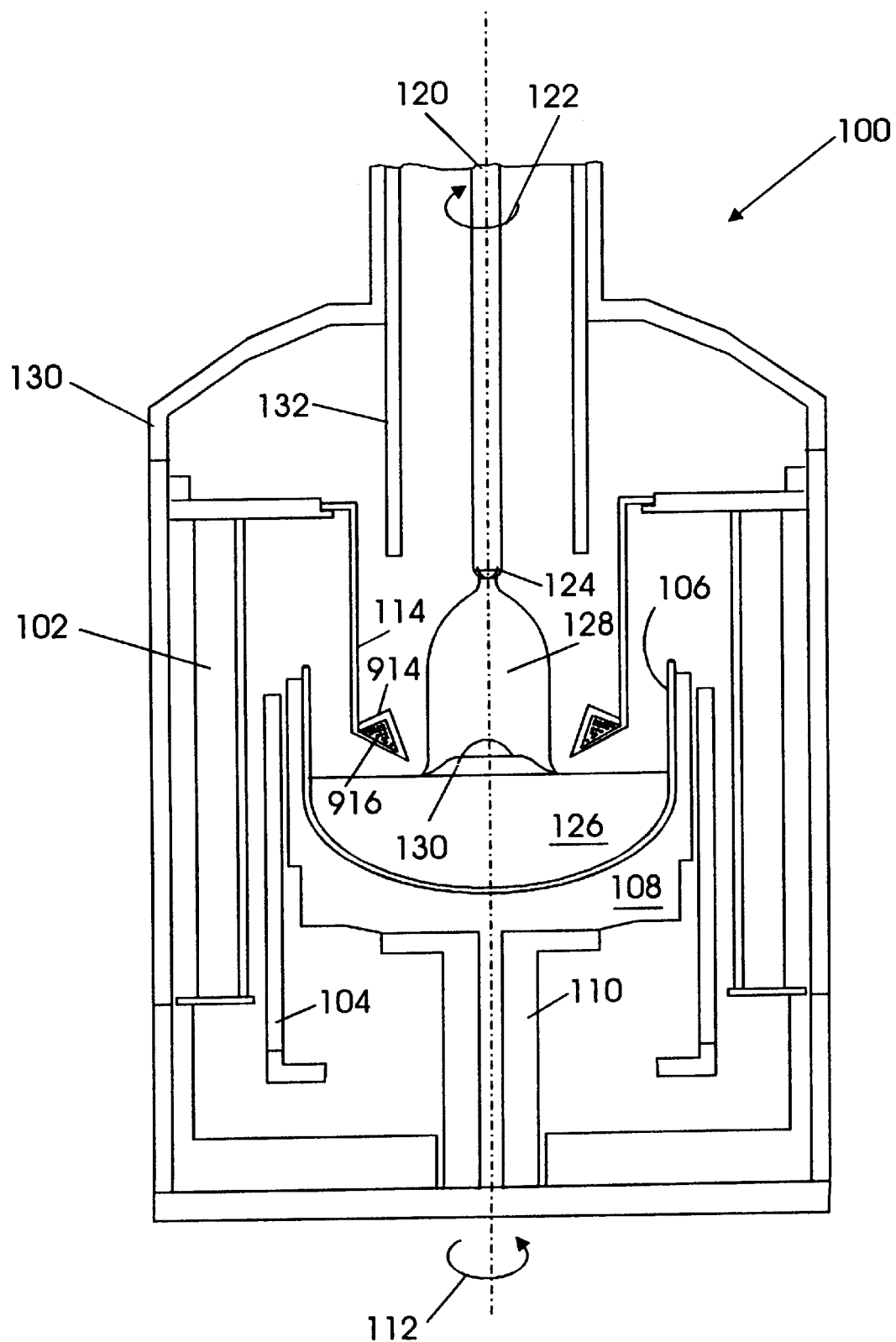
FIG. 9 is a schematic representation of a Czochralski puller that is modified according to the present invention to form perfect silicon.

Continuing with the description of FIG. 5, at Block 504 if the radial change in V/G that is determined at Block 502 is too large to satisfy the conditions for semi-pure or pure wafers (FIGS. 3D and 4D), then the hot zone may be modified at Block 506 and again simulated, until the gradient is sufficiently small to satisfy the desired conditions. In particular, as shown in FIG. 9, the hot zone may be modified by adding a cover 914 to hot zone shield 114 and filling the space between the cover 914 and the hot zone shield 114 with a heat conservation material, such as carbon ferrite. Other hot zone modifications may be made to reduce the temperature gradient as necessary.

Referring again to FIG. 5, a simulation of the axial change in V/G is performed at Block 508 to determine the change in $\Delta(V/G)$ as the ingot is pulled. Again, a test is made at Block 510 as to whether the change is sufficiently small to maintain the desired characteristics as the wafer is grown. If not the hot zone is modified at Block 506. Then, at Block 512, the pull rate profile is determined in order to maintain the critical V/G, as shown in FIGS. 3E or 4E. Ingots are then fabricated at Block 514 using this pull rate. Preferably, a pull rate profile is used in Block 512 that maintains V/G midway between the critical ratios, so as to maintain a guard band that can account for typical process variations.

Pull Rate Profile by Axial Slicing

Figure 6:
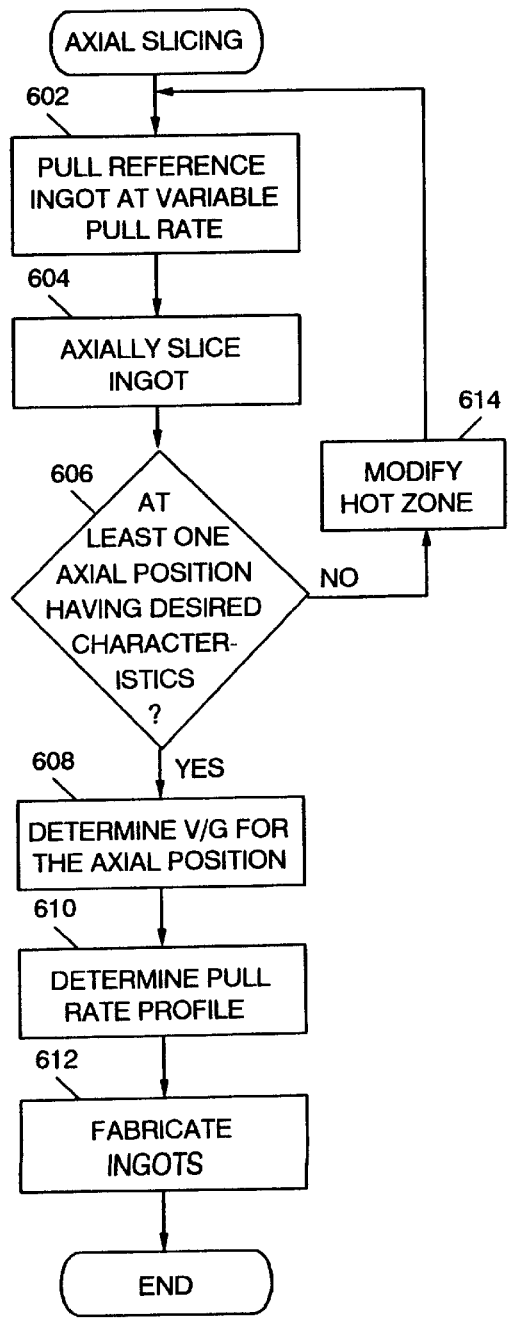
FIG. 6 illustrates empirical determination of pull rate profiles using axial slicing according to the present invention.
Figure 10:
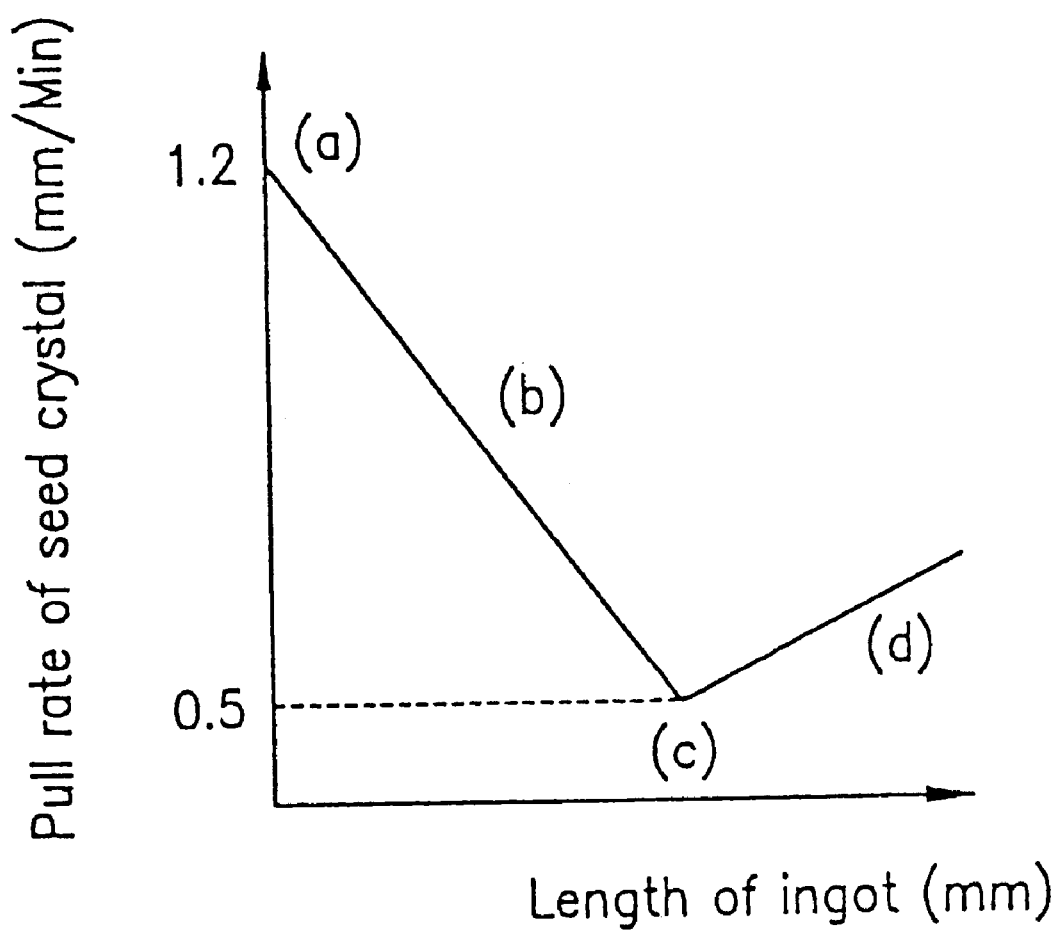
FIG. 10 illustrates variation of pull rate in order to determine a preferred pull rate profile according to the present invention.
Figure 11:
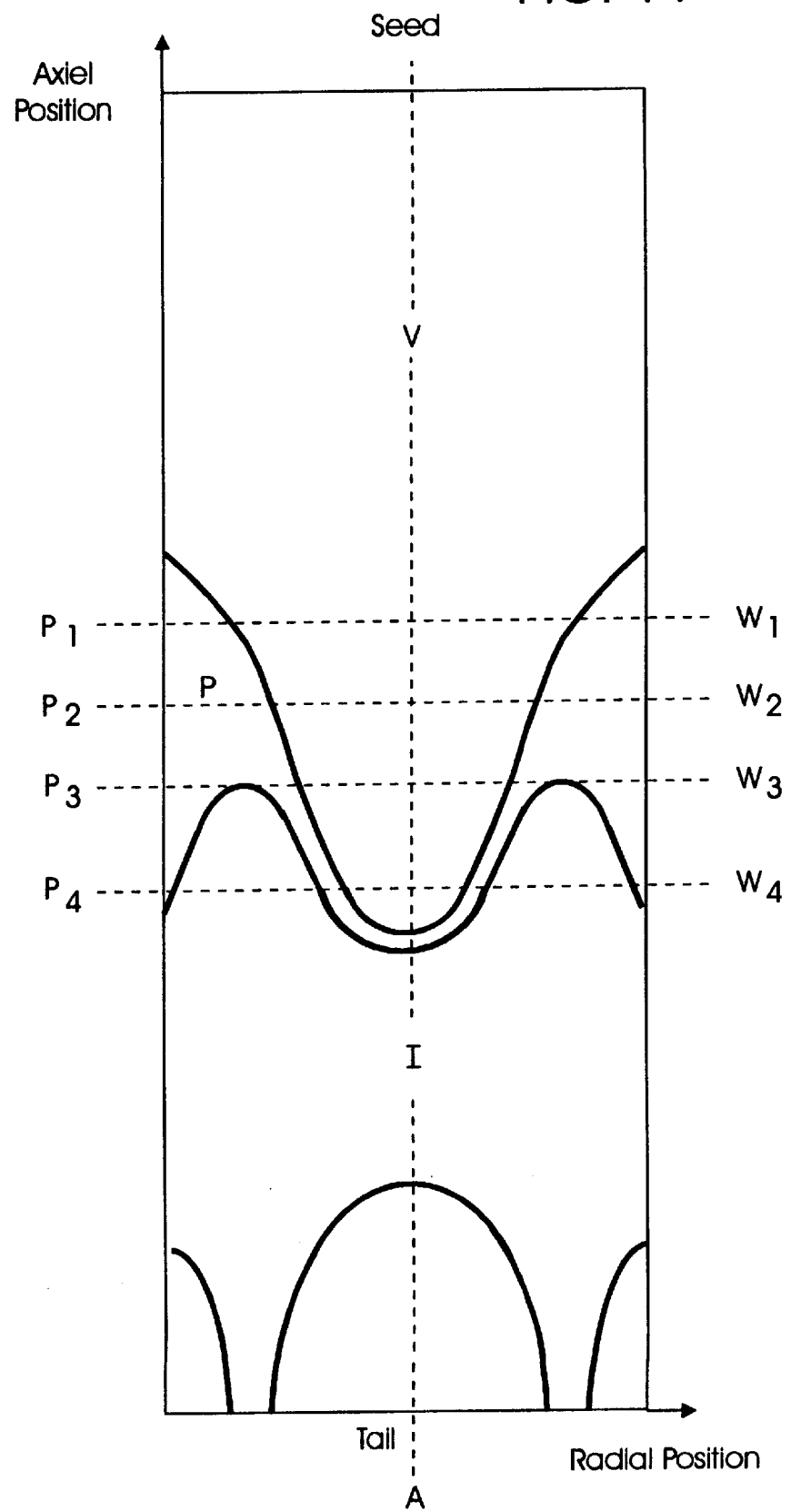
FIG. 11 is a representation of an X-Ray Topography image illustrating vacancy rich, interstitial rich and perfect regions of a first reference ingot according to the present invention.
Figure 12:
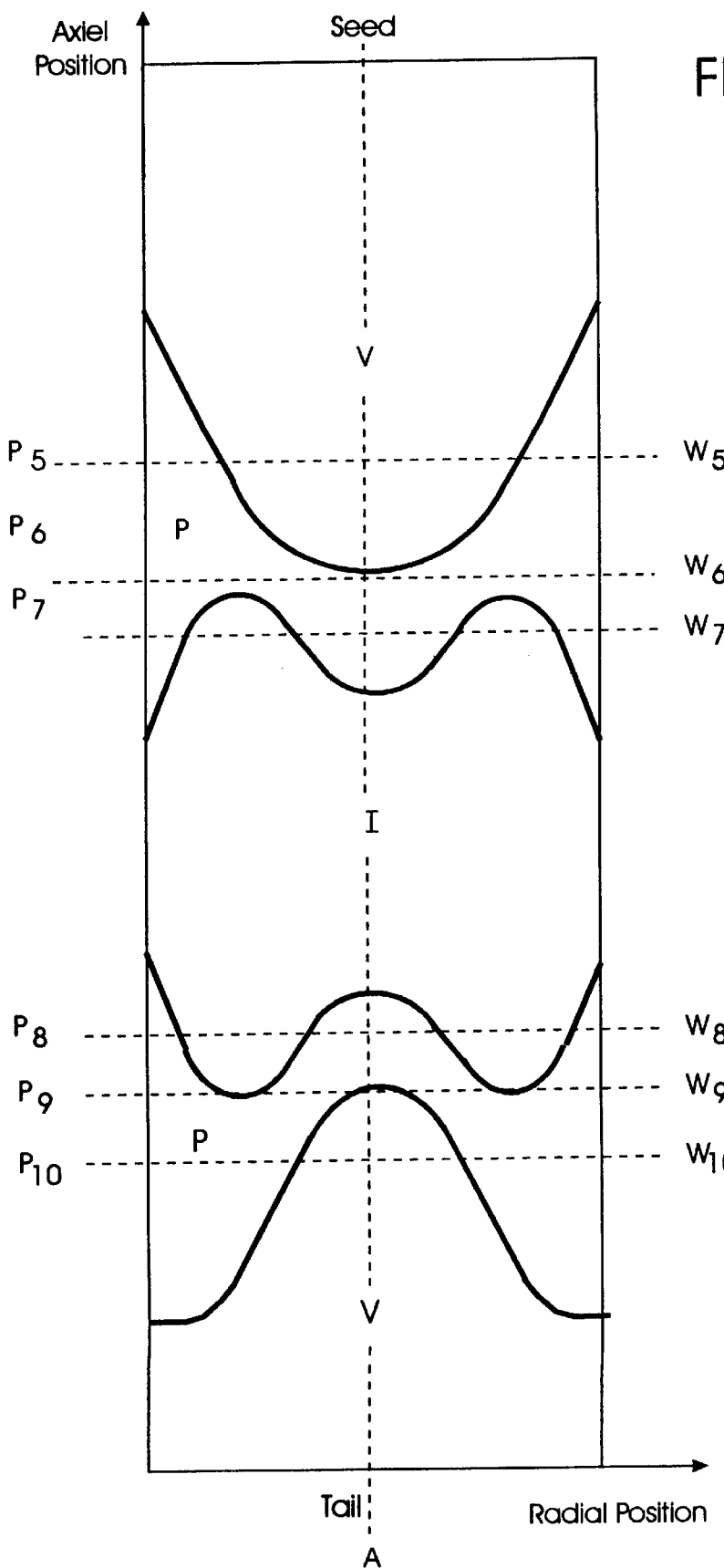
FIG. 12 is a representation of an X-Ray Topography image illustrating vacancy rich, interstitial rich and perfect regions of a second reference ingot according to the present invention.

Referring now to FIG. 6, empirical determination of pull rate profiles using axial slicing will now be described. As shown in FIG. 6, a reference ingot is pulled at a variable pull rate at Block 602. In order to determine a preferred pull rate profile, a range of pull rates is used, as illustrated in FIG. 10. As shown in FIG. 10, the pull rate is adjusted from a high pull rate (a), such as 1.2 mm/min, to a low pull rate (c) of 0.5 mm/min and back to a high pull rate. The low pull rate may be as low as 0.4 mm/min or lower. The change in pull rate (b) and (d) is preferably linear. Ingots having cross-sections as shown in FIGS. 11 and 12 may be produced. FIGS. 11 and 12 illustrate vacancy rich, interstitial rich and perfect regions [V], [I] and [P], respectively in an ingot. It will be understood by those having skill in the art that these regions may have varying concentrations of agglomerates which are not shown by the line drawings of FIGS. 11 and 12.

Referring back to FIG. 6, the ingot is axially sliced at Block 604. Thus, referring to FIG. 11, for semi-pure silicon, the ingot is sliced axially, agglomerate concentrations are measured in the axial slice using conventional techniques such as copper decoration, secco-etching, X-Ray Topography analysis, lifetime measurements or other conventional techniques. Preferably, X-Ray Topography analysis and lifetime measurements are performed after the ingot is axially cut, mirror etched and annealed in a nitrogen environment for 4 hours at 800° C. and for 16 hours at 1000° C. As shown in FIG. 11, axial position $P_1$ will have a large vacancy rich region and a relatively small perfect region. Axial position $P_2$ has a smaller vacancy rich region and a larger perfect region. Axial position $P_3$ has the smallest possible vacancy rich region and the largest possible perfect region, without introducing an interstitial agglomerate rich region. Axial position $P_4$ has a very small vacancy rich region, but has a large interstitial rich region which is undesirable. Accordingly, at Block 608, the V/G is determined for axial position $P_3$ based on its axial position along the ingot of FIG. 11. At Block 610, a pull rate profile that satisfies V/G is then determined for this position $P_3$ as the wafer is pulled, and ingots are then fabricated.

It will be understood by those having skill in the art that the axial position $P_3$ may not be used in actual production because process variations may cause the growth of an interstitial region. Accordingly, an axial position between position $P_2$ and $P_3$ may be selected so that an acceptably small vacancy rich region may be included without introducing interstitial agglomerates, notwithstanding process variations.

Axial ingot slicing may also be performed on an ingot pulled in a hot zone that is designed for pure silicon. Such an ingot is shown in FIG. 12. As with FIG. 11, vacancy rich, perfect and interstitial rich regions [V], [I] and [P] are shown. As shown in FIG. 12, axial positions $P_5$–$P_{10}$ include vacancy rich central areas similar to those described in connection with FIG. 11. Positions $P_7$ and $P_{10}$ include an interstitial rich ring and a perfect center. However, positions $P_6$ and $P_9$ are all perfect, because there are no vacancies at the center and no interstitials at the edge. Accordingly, at Block 606, an axial position corresponding to positions $P_6$ or $P_9$ is selected and V/G is determined for this axial position at Block 608. A pull rate profile to maintain this V/G is determined at Block 610 and ingots are fabricated at Block 612. It will be understood by those having skill in the art that a range of axial positions adjacent positions $P_6$ and $P_9$ may be selected to produce pure silicon. Accordingly, the actual V/G may be selected to allow for process variations while still maintaining perfect silicon characteristics.

Pull Rate Profile by Wafer Identification

Figure 7:
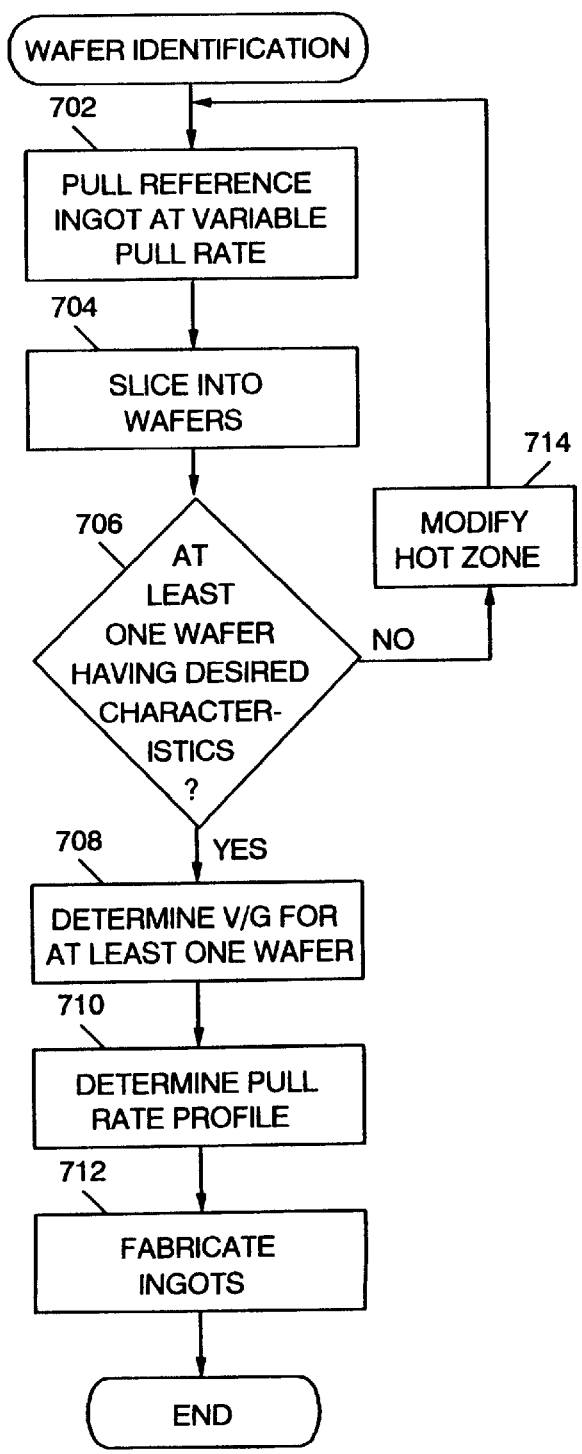
FIG. 7 illustrates empirical determination of pull rate profiles by wafer identification according to the present invention.

Referring now to FIG. 7, empirical determination of pull rate profiles by wafer identification will now be described. As shown in FIG. 7, a reference ingot is pulled at a variable pull rate at Block 702. In order to determine a preferred pull rate profile, a range of pull rates is preferably used, as described in FIG. 10. For example, the pull rate is adjusted from a high pull rate (a), here 1.2 mm/min, to a low pull rate (c) of 0.5 mm/min and back to a high pull rate. The low pull rate may be as low as 0.4 mm/min or lower. The change in pull rate (b) and (d) is preferably linear. An ingot having a cross-section as shown in FIG. 11 or FIG. 12 may be produced.

Referring back to FIG. 7, the ingot is radially sliced at Block 704 to produce a plurality of wafers. Thus, referring to FIG. 11, for semi-pure silicon, the ingot is sliced to provide representative wafers $W_1$–$W_4$. Agglomerate concentrations are then measured in these wafers using conventional techniques such as copper decoration, secco etching, lifetime measurements or other conventional techniques. As shown in FIG. 11, wafer $W_1$ will have a large vacancy rich region and a relatively small perfect region. Wafer $W_2$ has a smaller vacancy rich region and a larger perfect region. Wafer $W_3$ has the smallest possible vacancy rich region and the largest possible perfect region, without introducing an interstitial agglomerate rich region. Wafer $W_4$ has a very small vacancy rich region, but has a large interstitial rich region which is undesirable. Accordingly, at Block 708, V/G is determined for wafer $W_3$ based on its axial position along the ingot of FIG. 11. At Block 710, a pull rate profile is then determined for this wafer $W_3$ as the wafer is pulled, and ingots are then fabricated.

It will be understood by those having skill in the art that the axial position of wafer $W_3$ may not be used in actual production because process variations may cause the growth of an interstitial region. Accordingly, an axial position of a wafer between wafers $W_3$ and $W_2$ may be selected so that an acceptably small vacancy rich region may be included without introducing interstitial agglomerates, notwithstanding process variations.

Wafer slicing may also be performed on an ingot pulled in a hot zone that is designed for perfect silicon. Such an ingot is shown in FIG. 12. As with FIG. 11, vacancy rich, perfect and interstitial rich regions [V], [I] and [P] are shown. As shown in FIG. 12, a plurality of wafers $W_5$–$W_{10}$ may be produced. Wafers $W_5$ and $W_{10}$ include vacancy rich central areas similar to those described in connection with FIG. 11. Wafers $W_7$ and $W_8$ include an interstitial rich ring and a perfect center. However, wafers $W_6$ and $W_9$ are all perfect, because there are no vacancies at the center and no interstitials at the edge. Accordingly, at Block 706, the axial position corresponding to wafer $W_6$ or $W_9$ is selected and V/G is determined for this axial position at Block 708. A pull rate profile to maintain this V/G is determined at Block 710 and ingots are fabricated at Block 712. It will be understood by those having skill in the art that a range of wafer positions adjacent positions $W_6$ and $W_9$ may be selected to produce pure silicon. Accordingly, the actual V/G may be selected to allow for process variations while still maintaining perfect silicon characteristics.

Pull Rate Profile by Empirical and Simulation Techniques

Figure 8:
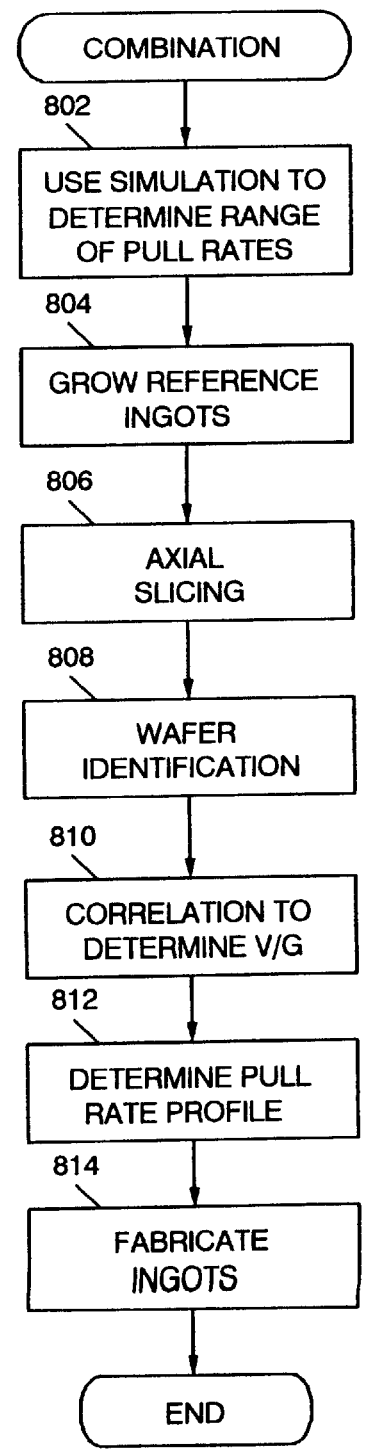
FIG. 8 illustrates a combination of simulation, axial slicing and wafer identification to fabricate ingots according to the present invention.

Referring now to FIG. 8, a combination of simulation, axial slicing and wafer identification may be used in order to fabricate ingots according to the present invention. As shown in FIG. 8 at Block 802, simulation may be used to determine a range of pull rates. At Block 804, a plurality of reference ingots may be grown. Some of the ingots are axially sliced at Block 806, and some of the ingots are sliced into wafers at Block 808. The optimum V/G is determined by correlating the results of axial slicing, wafer identification and simulation at Block 810. A pull rate profile is then determined at Block 812 and ingots are fabricated at Block 814. This process may be performed twice to obtain pure silicon, so that the hot zone may be modified as necessary after obtaining semi-pure silicon.

Figure 13:
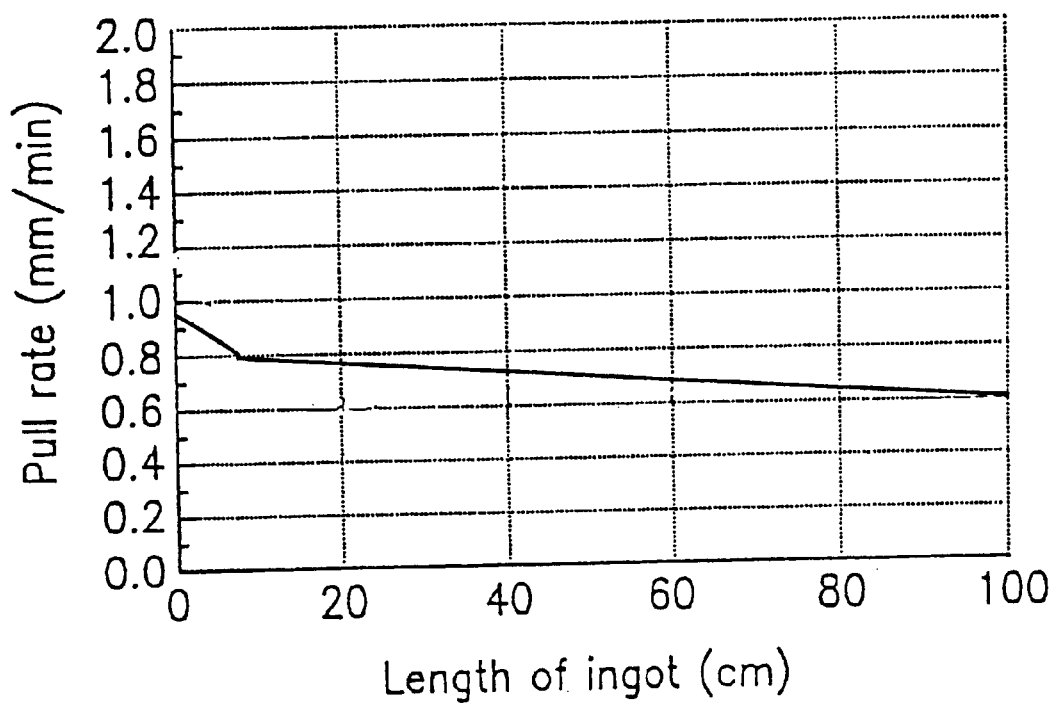
FIGS. 13 and 14 graphically illustrate a pull rate profile for growing vacancy rich wafers and perfect wafers, respectively, according to the present invention.
Figure 14:
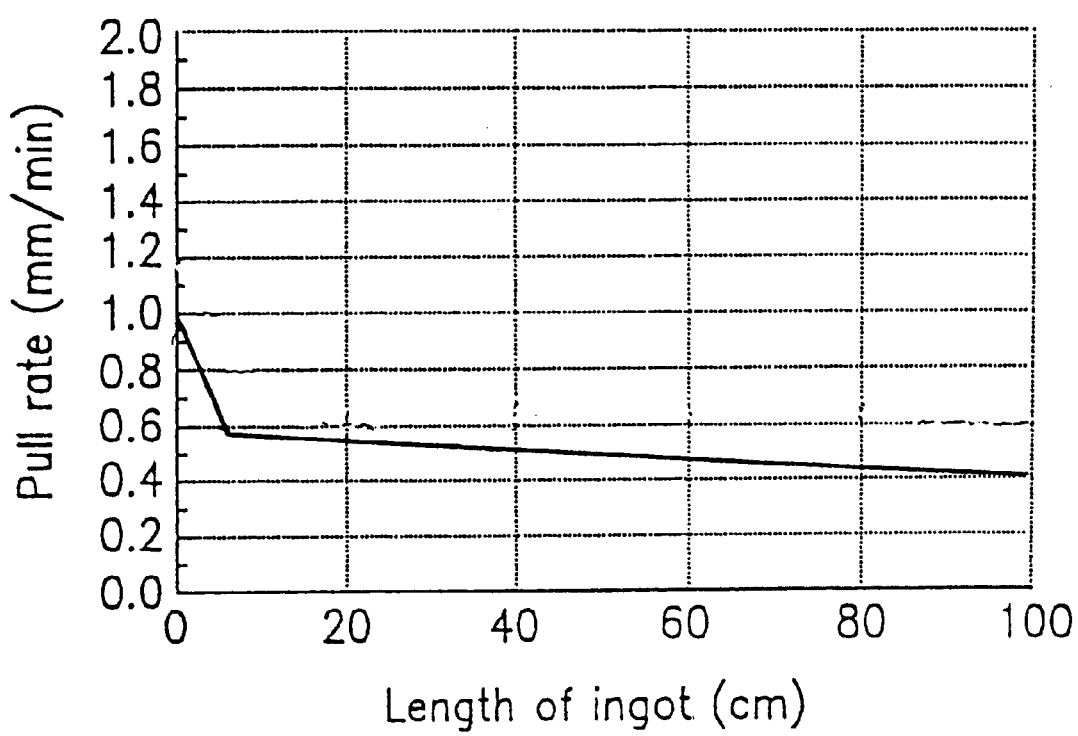

The actual pull rate profile will depend on many variables, including but not limited to the desired diameter of ingot, the specific hot zone furnace that is being used and the quality of the silicon melt. FIGS. 13 and 14 illustrate pull rate profiles that were determined using a combination of simulation and empirical techniques (FIG. 8). FIG. 13 illustrates a pull rate profile for growing a 100 cm long, 200 mm diameter ingot, to form a vacancy rich region of 12 cm diameter and to provide a pure silicon region of 64% area. A Model Q41 hot zone furnace manufactured by Mitsubishi Material Ikuno was used. FIG. 14 illustrates a pull rate profile to grow pure silicon, using the same ingot parameters as FIG. 13 except that a modified hot zone of FIG. 11 was used.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of manufacturing a silicon ingot in a hot zone furnace comprising the step of:

pulling the ingot from a silicon melt in the hot zone furnace in an axial direction at a pull rate profile of the ingot from the silicon melt in the hot zone furnace that is sufficiently high so as to prevent interstitial agglomerates but is sufficiently low so as to confine vacancy agglomerates to a vacancy rich region at the axis of the ingot.

2. A method according to claim 1 wherein the pulling step is followed by the step of slicing the ingot so pulled into a plurality of semi-perfect wafers having a vacancy rich region at the center thereof that includes vacancy agglomerates and a pure region between the vacancy rich region and the wafer edge that is free of vacancy agglomerates and interstitial agglomerates.

3. A method according to claim 2 wherein the wafers have a wafer area and wherein the pure region is at least 36% of the wafer area.

4. A method according to claim 3 wherein the pure region is at least 60% of the wafer area.

5. A method according to claim 1 wherein the pulling step is preceded by the step of:

determining a first critical ratio of pull rate to temperature gradient at the ingot-melt interface that must be maintained in order to prevent interstitial agglomerates;

determining a second critical ratio of pull rate to temperature gradient at the ingot-melt interface that cannot be exceeded in order to confine vacancy agglomerates to the vacancy rich region at the center of the ingot; and determining a pull rate profile that maintains the ratio of pull rate to temperature gradient in the ingot above the first critical ratio and below the second critical ratio as the ingot is pulled from the silicon melt in the hot zone furnace.

6. A method according to claim 5 wherein the steps of determining a first critical ratio and a second critical ratio comprise the steps of:

pulling a reference ingot from a silicon melt in the hot zone furnace at a pull rate that varies from about 0.5 mm/min to about 1.2 mm/min;

slicing the reference ingot into wafers;

identifying a wafer having a smallest vacancy rich region and that is free of interstitial agglomerates; and calculating the first and second critical ratios from the pull rate of the identified wafer and the position of the identified wafer in the ingot.

7. A method according to claim 6 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

8. A method according to claim 7 wherein the pull rate varies linearly from about 0.5 mm/min to about 1.2 mm/min.

9. A method according to claim 5 wherein the steps of determining a first critical ratio and a second critical ratio comprise the steps of:

pulling a reference ingot from a silicon melt in the hot zone furnace at a pull rate that varies from about 0.5 mm/min to about 1.2 mm/min;

axially slicing the reference ingot;

identifying at least one axial position in the axially sliced reference ingot, having a smallest vacancy rich region and that is free of interstitial agglomerates; and calculating the first and second critical ratios from the pull rate of the identified at least one axial position and the at least one identified axial position in the axially sliced ingot.

10. A method according to claim 9 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

11. A method according to claim 10 wherein the pull rate varies linearly from about 0.5 mm/min to about 1.2 mm/min.

12. A method according to claim 5 wherein the steps of determining a first critical ratio and a second critical ratio comprise the steps of:

identifying the first and second critical ratios from Voronkov's Theory;

determining a pull rate to radial temperature gradient profile by simulating operation of the hot zone furnace during ingot pulling;

determining a pull rate to axial temperature gradient profile by simulating operation of the hot zone furnace during ingot pulling; and determining a pull rate profile that maintains the ratio of pull rate to temperature gradient in the ingot above the first critical ratio and below the second critical ratio as the ingot is pulled from the silicon melt in the hot zone furnace, from the simulated pull rate to radial temperature profile and the simulated pull rate to axial temperature profile.

13. A method according to claim 1 wherein the pulling step is preceded by the steps of:

pulling a reference ingot from a silicon melt in the hot zone furnace at a pull rate that varies from about 0.5 mm/min to about 1.2 mm/min;

slicing the reference ingot into wafers;

identifying a wafer having a smallest vacancy rich region and that is free of interstitial agglomerates;

calculating a ratio of pull rate to temperature gradient at the ingot-melt interface for the wafer having the smallest vacancy rich region and that is free of interstitial agglomerates, from the pull rate of the identified wafer and the position of the identified wafer in the ingot; and determining a pull rate profile that maintains the ratio as the ingot is pulled from the silicon melt in the hot zone furnace.

14. A method according to claim 13 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

15. A method according to claim 1 wherein the pulling step is preceded by the steps of:

pulling a reference ingot from a silicon melt in the hot zone furnace at a pull rate that varies from about 0.5 mm/min to about 1.2 mm/min;

axially slicing the reference ingot;

identifying at least one axial position in the axially sliced reference ingot, having a smallest vacancy rich region and that is free of interstitial agglomerates;

calculating a ratio of pull rate to temperature gradient at the ingot-melt interface for the at least one axial position having the smallest vacancy rich region and that is free of interstitial agglomerates, from the pull rate of the identified wafer and the at least one axial position in the axially sliced ingot; and determining a pull rate profile that maintains the ratio as the ingot is pulled from the silicon melt in the hot zone furnace.

16. A method according to claim 15 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

17. A method according to claim 1 wherein the pulling step is preceded by the steps of:

determining a pull rate to radial temperature gradient profile by simulating operation of the hot zone furnace during ingot pulling;

determining a pull rate to axial temperature gradient profile by simulating operation of the hot zone furnace during ingot pulling;

determining a pull rate profile that maintains the ratio of pull rate to radial and axial temperature gradients in a range that prevents interstitial agglomerates and confines vacancy agglomerates to a vacancy rich region at the axis of the ingot, from the simulated pull rate to radial temperature profile and the simulated pull rate to axial temperature profile and from Voronkov's theory.

18. A method of manufacturing a silicon ingot in a hot zone furnace comprising the step of:

pulling the ingot from a silicon melt in the hot zone furnace at a pull rate profile of the ingot from the silicon melt in the hot zone furnace that is sufficiently high so as to prevent interstitial agglomerates but is sufficiently low so as to prevent vacancy agglomerates.

19. A method according to claim 18 wherein the pulling step is followed by the step of slicing the ingot so pulled into a plurality of pure wafers, that are free of vacancy agglomerates and interstitial agglomerates.

20. A method according to claim 18 wherein the pulling step is preceded by the step of:

determining a first critical ratio of pull rate to temperature gradient at the ingot-melt interface that must be maintained in order to prevent interstitial agglomerates and a second critical ratio of pull rate to temperature gradient at the ingot-melt interface that cannot be exceeded in order to prevent vacancy agglomerates; and determining a pull rate profile that maintains the ratio of pull rate to temperature gradient above the first critical ratio and below the second critical ratio as the ingot is pulled from the silicon melt in the hot zone furnace.

21. A method according to claim 20 wherein the steps of determining a first critical ratio and a second critical ratio comprise the steps of:

pulling a reference ingot from a silicon melt in the hot zone furnace at a pull rate that varies from about 0.5 mm/min to about 1.2 mm/min;

slicing the reference ingot into wafers;

identifying a wafer that is free of vacancy agglomerates and interstitial agglomerates; and calculating the first and second critical ratios from the pull rate of the identified wafer and the position of the identified wafer in the ingot.

22. A method according to claim 21 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

23. A method according to claim 22 wherein the pull rate varies linearly from about 0.5 mm/min to about 1.2 mm/min.

24. A method according to claim 20 wherein the steps of determining a first critical ratio and a second critical ratio comprise the steps of:

pulling a reference ingot from a silicon melt in the hot zone furnace at a pull rate that varies from about 0.5 mm/min to about 1.2 mm/min;

axially slicing the reference ingot;

identifying at least one axial position in the axially sliced reference ingot that is free of vacancy agglomerates and interstitial agglomerates; and calculating the first and second critical ratios from the pull rate of the identified at least one axial position and the at least one identified axial position in the axially sliced ingot.

25. A method according to claim 24 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

26. A method according to claim 25 wherein the pull rate varies linearly from about 0.5 mm/min to about 1.2 mm/min.

27. A method according to claim 20 wherein the steps of determining a first critical ratio and a second critical ratio comprise the steps of:

identifying the first and second critical ratios from Voronkov's Theory;

determining a pull rate to radial temperature gradient profile by simulating operation of the hot zone furnace during ingot pulling;

determining a pull rate to axial temperature gradient profile by simulating operation of the hot zone furnace during ingot pulling; and determining a pull rate profile that maintains the ratio of pull rate to temperature gradient in the ingot above the first critical ratio and below the second critical ratio as the ingot is pulled from the silicon melt in the hot zone furnace, from the simulated pull rate to radial temperature profile and the simulated pull rate to axial temperature profile.

28. A method according to claim 18 wherein the pulling step is preceded by the steps of:

pulling a reference ingot from a silicon melt in the hot zone furnace at a pull rate that varies from about 0.5 mm/min to about 1.2 mm/min;

slicing the reference ingot into wafers;

identifying a wafer that is free of vacancy agglomerates and interstitial agglomerates;

calculating a ratio of pull rate to temperature gradient at the ingot-melt interface for the wafer that is free of vacancy agglomerates and interstitial agglomerates, from the pull rate of the identified wafer and the position of the identified wafer in the ingot; and determining a pull rate profile that maintains the ratio as the ingot is pulled from the silicon melt in the hot zone furnace.

29. A method according to claim 28 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

30. A method according to claim 18 wherein the pulling step is preceded by the steps of:

pulling a reference ingot from a silicon melt in the hot zone furnace at a pull rate that varies from about 0.5 mm/min to about 1.2 mm/min;

axially slicing the reference ingot;

identifying at least one axial position in the axially sliced reference ingot, that is free of vacancy agglomerates and interstitial agglomerates;

calculating a ratio of pull rate to temperature gradient at the ingot-melt interface for the at least one axial position that is free of vacancy agglomerates and interstitial agglomerates, from the pull rate of the identified wafer and the at least one axial position in the axially sliced ingot; and determining a pull rate profile that maintains the ratio as the ingot is pulled from the silicon melt in the hot zone furnace.

31. A method according to claim 30 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that from a pull rate of about 1.2 mm/min, to a pull rate of about 0.5 mm/min and then to a pull rate that is greater than 0.5 mm/min.

32. A method according to claim 18 wherein the pulling step is preceded by the steps of:

determining a pull rate to radial temperature gradient profile by simulating operation of the hot zone furnace during ingot pulling;

determining a pull rate to axial temperature gradient profile by simulating operation of the hot zone furnace during ingot pulling;

determining a pull rate profile that maintains the ratio of pull rate to radial and axial temperature gradients in a range that prevents vacancy agglomerates and interstitial agglomerates, from the simulated pull rate to radial temperature profile and the simulated pull rate to axial temperature profile and from Voronkov's theory.

33. A method of manufacturing a silicon ingot in a hot zone furnace comprising the step of:

pulling the ingot from a silicon melt in the hot zone furnace at a pull rate profile of the ingot from the silicon melt in the hot zone furnace that produces semi-perfect wafers having a vacancy rich region at the center thereof that includes vacancy agglomerates, and a pure region between the vacancy rich region and the wafer edge that includes interstitial point defects but is free of vacancy agglomerates and interstitial agglomerates.

34. A method according to claim 33 wherein the pulling step is followed by the step of slicing the ingot so pulled into a plurality of wafers having a vacancy rich region at the center thereof that includes vacancy agglomerates and a pure region between the vacancy rich region and the wafer edge that is free of vacancy agglomerates and interstitial agglomerates.

35. A method according to claim 34 wherein the wafers have a wafer area and wherein the pure region is at least 36% of the wafer area.

36. A method according to claim 35 wherein the pure region is at least 60% of the wafer area.

37. A method according to claim 33 wherein the pulling step is preceded by the step of:

determining a first critical ratio of pull rate to temperature gradient at the ingot-melt interface that must be maintained in order to prevent interstitial agglomerates;

determining a second critical ratio of pull rate to temperature gradient at the ingot-melt interface that cannot be exceeded in order to confine vacancy agglomerates to the vacancy rich region at the center of the ingot; and determining a pull rate profile that maintains the ratio of pull rate to temperature gradient in the ingot above the first critical ratio and below the second critical ratio as the ingot is pulled from the silicon melt in the hot zone furnace.

38. A method according to claim 37 wherein the steps of determining a first critical ratio and a second critical ratio comprise the steps of:

pulling a reference ingot from a silicon melt in the hot zone furnace at a pull rate that varies from about 0.5 mm/min to about 1.2 mm/min;

slicing the reference ingot into wafers;

identifying a wafer having a smallest vacancy rich region and that is free of interstitial agglomerates; and calculating the first and second critical ratios from the pull rate of the identified wafer and the position of the identified wafer in the ingot.

39. A method according to claim 38 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

40. A method according to claim 39 wherein the pull rate varies linearly from about 0.5 mm/min to about 1.2 mm/min.

41. A method according to claim 37 wherein the steps of determining a first critical ratio and a second critical ratio comprise the steps of:

pulling a reference ingot from a silicon melt in the hot zone furnace at a pull rate that varies from about 0.5 mm/min to about 1.2 mm/min;

axially slicing the reference ingot;

identifying at least one axial position in the axially sliced reference ingot, having a smallest vacancy rich region and that is free of interstitial agglomerates; and calculating the first and second critical ratios from the pull rate of the identified at least one axial position and the at least one identified axial position in the axially sliced ingot.

42. A method according to claim 41 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

43. A method according to claim 42 wherein the pull rate varies linearly from about 0.5 mm/min to about 1.2 mm/min.

44. A method according to claim 37 wherein the steps of determining a first critical ratio and a second critical ratio comprise the steps of:

identifying the first and second critical ratios from Voronkov's Theory;

determining a pull rate to radial temperature gradient profile by simulating operation of the hot zone furnace during ingot pulling;

determining a pull rate to axial temperature gradient profile by simulating operation of the hot zone furnace during ingot pulling; and determining a pull rate profile that maintains the ratio of pull rate to temperature gradient in the ingot above the first critical ratio and below the second critical ratio as the ingot is pulled from the silicon melt in the hot zone furnace, from the simulated pull rate to radial temperature profile and the simulated pull rate to axial temperature profile.

45. A method of manufacturing a silicon ingot in a hot zone furnace comprising the step of:

pulling the ingot from a silicon melt in the hot zone furnace at a pull rate profile of the ingot from the silicon melt in the hot zone furnace that produces perfect wafers, that include point defects but are free of vacancy agglomerates and interstitial agglomerates.

46. A method according to claim 45 wherein the pulling step is followed by the step of slicing the ingot so pulled into a plurality of pure wafers, that are free of vacancy agglomerates and interstitial agglomerates.

47. A method according to claim 45 wherein the pulling step is preceded by the step of:

determining a first critical ratio of pull rate to temperature gradient at the ingot-melt interface that must be maintained in order to prevent interstitial agglomerates and a second critical ratio of pull rate to temperature gradient at the ingot-melt interface that cannot be exceeded in order to prevent vacancy agglomerates; and determining a pull rate profile that maintains the ratio of pull rate to temperature gradient above the first critical ratio and below the second critical ratio as the ingot is pulled from the silicon melt in the hot zone furnace.

48. A method according to claim 47 wherein the steps of determining a first critical ratio and a second critical ratio comprise the steps of:

pulling a reference ingot from a silicon melt in the hot zone furnace at a pull rate that varies from about 0.5 mm/min to about 1.2 mm/min;

slicing the reference ingot into wafers;

identifying a wafer that is free of vacancy agglomerates and interstitial agglomerates; and calculating the first and second critical ratios from the pull rate of the identified wafer and the position of the identified wafer in the ingot.

49. A method according to claim 48 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

50. A method according to claim 49 wherein the pull rate varies linearly from about 0.5 mm/min to about 1.2 mm/min.

51. A method according to claim 47 wherein the steps of determining a first critical ratio and a second critical ratio comprise the steps of:

pulling a reference ingot from a silicon melt in the hot zone furnace at a pull rate that varies from about 0.5 mm/min to about 1.2 mm/min;

axially slicing the reference ingot;

identifying at least one axial position in the axially sliced reference ingot that is free of vacancy agglomerates and interstitial agglomerates; and calculating the first and second critical ratios from the pull rate of the identified at least one axial position and the at least one identified axial position in the axially sliced ingot.

52. A method according to claim 51 wherein the step of pulling a reference ingot from a silicon melt in the hot zone furnace at a pull rate that varies from about 0.5 mm/min to about 1.2 mm/min comprises the step of:

pulling the reference ingot from the silicon melt in the hot zone furnace at a pull rate that varies from a pull rate of about 1.2 mm/min, to a pull rate of about 0.5 mm/min and then to a pull rate that is greater than 0.5 mm/min.

53. A method according to claim 52 wherein the pull rate varies linearly from about 0.5 mm/min to about 1.2 mm/min.

54. A method according to claim 47 wherein the steps of determining a first critical ratio and a second critical ratio comprise the steps of:

identifying the first and second critical ratios from Voronkov's Theory;

determining a pull rate to radial temperature gradient profile by simulating operation of the hot zone furnace during ingot pulling;

determining a pull rate to axial temperature gradient profile by simulating operation of the hot zone furnace during ingot pulling; and determining a pull rate profile that maintains the ratio of pull rate to temperature gradient in the ingot above the first critical ratio and below the second critical ratio as the ingot is pulled from the silicon melt in the hot zone furnace, from the simulated pull rate to radial temperature profile and the simulated pull rate to axial temperature profile.

* * * * *

UNITED STATES PATENT AND TRADEMARK OFFICE
CERTIFICATE OF CORRECTION

PATENT NO. : 6,045,610
DATED : April 4, 2000
INVENTOR(S) : Park et al.

It is certified that error appears in the above-identified patent and that said Letters Patent is hereby corrected as shown below:

On the title page, and column 1, line 5:

In the Title:

Please delete "FURNANCE" and substitute -- FURNACE -- therefor.

Signed and Sealed this

Thirteenth Day of February, 2001

*Attest:*

NICHOLAS P. GODICI

*Attesting Officer*    Acting Director of the United States Patent and Trademark Office